(12) United States Patent
Shiga

(10) Patent No.: US 11,955,176 B2
(45) Date of Patent: Apr. 9, 2024

(54) NONVOLATILE SEMICONDUCTOR STORAGE DEVICE HAVING MEMORY STRINGS AND BIT LINES ON OPPOSITE SIDES OF THE MEMORY STRINGS

(71) Applicant: KIOXIA CORPORATION, Tokyo (JP)

(72) Inventor: Hidehiro Shiga, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/459,974

(22) Filed: Aug. 27, 2021

(65) Prior Publication Data

US 2022/0310159 A1 Sep. 29, 2022

(30) Foreign Application Priority Data

Mar. 23, 2021 (JP) .................................. 2021-049290

(51) Int. Cl.
   *G11C 16/04* (2006.01)
   *G11C 5/06* (2006.01)
   (Continued)

(52) U.S. Cl.
   CPC .......... *G11C 16/0433* (2013.01); *G11C 5/063* (2013.01); *G11C 7/18* (2013.01);
   (Continued)

(58) Field of Classification Search
   None
   See application file for complete search history.

(56) References Cited

U.S. PATENT DOCUMENTS 8,059,461 B2   11/2011   Lee
8,320,182 B2   11/2012   Kirisawa et al.
(Continued)

FOREIGN PATENT DOCUMENTS

JP   2016-051485 A   4/2016
JP   2019-169211 A   10/2019
JP   2020-092141 A   6/2020

OTHER PUBLICATIONS

Chen et al. "A Highly Scalable 8-layer Vertical Gate 3D NAND with Split-page Bit Line Layout and Efficient Binary-sum MiLC (Minimal Incremental Layer Cost) Staircase Contacts" Tech Digest 2012 Electron Devices Meeting IEDM, pp. 2.3.1-2.3.4 (4 pages).

*Primary Examiner* — Kretelia Graham
(74) *Attorney, Agent, or Firm* — Kim & Stewart LLP

(57) ABSTRACT

A nonvolatile semiconductor storage device includes first and second semiconductor layers extending in a first direction and spaced apart in a second direction, first and second bit lines extending in the second direction and respectively arranged on opposite sides of the semiconductor layers in the first direction, first and second source lines extending in a third direction and respectively arranged on opposite sides of the semiconductor layers in the first direction, a first memory string including first and second select transistors connected to the first bit line and the first source line, respectively, a second memory string including third and fourth select transistors connected to the second bit line and the second source line, respectively, a first select gate line connected to gates of the first and fourth select transistors, and a second select gate line connected to gates of the second and third select transistors.

20 Claims, 16 Drawing Sheets

(51) Int. Cl.
  *G11C 7/18*    (2006.01)
  *G11C 16/08*   (2006.01)
  *G11C 16/24*   (2006.01)
  *G11C 16/26*   (2006.01)

(52) U.S. Cl.
  CPC .............. *G11C 16/08* (2013.01); *G11C 16/24* (2013.01); *G11C 16/26* (2013.01)

(56) References Cited

U.S. PATENT DOCUMENTS

| | | | |
|---|---|---|---|
| 8,873,293 B1* | 10/2014 | Ou | G11C 16/0483 365/185.17 |
| 9,633,732 B2 | 4/2017 | Lee | |
| 9,721,662 B1* | 8/2017 | Yang | G11C 16/3459 |
| 9,721,670 B1* | 8/2017 | Kim | G11C 11/413 |
| 10,453,535 B2 | 10/2019 | Rajwade et al. | |
| 2016/0064088 A1 | 3/2016 | Shiga et al. | |
| 2017/0092365 A1* | 3/2017 | Lee | G11C 16/3459 |
| 2019/0294495 A1 | 9/2019 | Takagiwa | |
| 2020/0176033 A1 | 6/2020 | Hosotani et al. | |
| 2021/0027840 A1* | 1/2021 | Park | G11C 16/24 |

\* cited by examiner

NONVOLATILE SEMICONDUCTOR STORAGE DEVICE HAVING MEMORY STRINGS AND BIT LINES ON OPPOSITE SIDES OF THE MEMORY STRINGS

CROSS-REFERENCE TO RELATED APPLICATION

This application is based upon and claims the benefit of priority from Japanese Patent Application No. 2021-049290, filed Mar. 23, 2021, the entire contents of which are incorporated herein by reference.

FIELD

Embodiments described herein relate generally to a nonvolatile semiconductor storage device.

BACKGROUND

NAND flash memory is known as one type of a nonvolatile semiconductor storage device.

DETAILED DESCRIPTION

Figure 1:
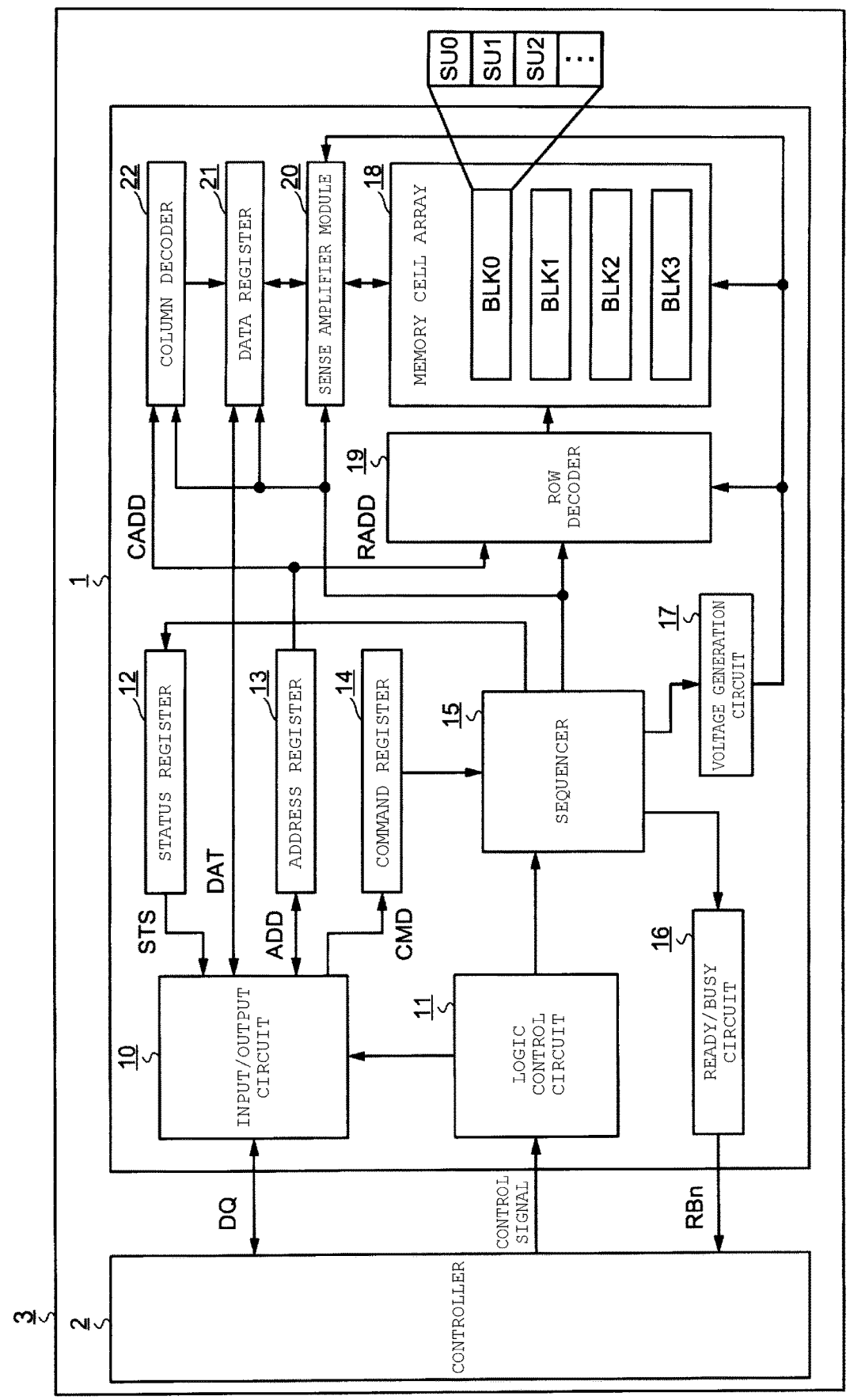
FIG. 1 is a block diagram showing a configuration of a memory system including a nonvolatile semiconductor storage device according to an embodiment.

Embodiments provide a nonvolatile semiconductor storage device that prevents an unintended operation of a memory string during a program operation.

In general, according to one embodiment, a nonvolatile semiconductor storage device includes: first and second semiconductor layers that extend in a first direction and are spaced apart from each other in a second direction that intersects the first direction, the first semiconductor layer having a first side that is on a side of the second semiconductor layer in the second direction and a second side that is on an opposite side of the first side of the first semiconductor layer, and the second semiconductor layer having a first side that is on a side of the first semiconductor layer in the second direction and a second side that is on an opposite side of the first side of the second semiconductor layer; first and second bit lines extending the second direction on opposite sides of the first and second semiconductor layers in the first direction; first and second source lines extending in a third direction that intersects the first and second directions and on opposite sides of the first and second semiconductor layers in the first direction; a first memory string on the first side of the first semiconductor layer and including a first select transistor connected to the first bit line, a second select transistor connected to the first source line, a plurality of first memory cell transistors connected between the first select transistor and the second select transistor; a second memory string on the second side of the first semiconductor layer and including a third select transistor connected to the first bit line, a fourth select transistor connected to the first source line, and a plurality of second memory cell transistors connected between the third select transistor and the fourth select transistor; a third memory string on the first side of the second semiconductor layer and including a fifth select transistor connected to the second bit line, a sixth select transistor connected to the second source line, and a plurality of third memory cell transistors connected between the fifth select transistor and the sixth select transistor; a fourth memory string on the second side of the second semiconductor layer and including a seventh select transistor connected to the second bit line, an eighth select transistor connected to the second source line, and a plurality of fourth memory cell transistors connected between the seventh select transistor and the eighth select transistor; a first select gate line that is electrically connected to a gate electrode of the first select transistor and a gate electrode of the sixth select transistor; and a second select gate line that is electrically connected to a gate electrode of the second select transistor and a gate electrode of the fifth select transistor.

Hereinafter, embodiments will be described with reference to the drawings. In the following description, elements having the same or similar functions and configurations are designated by common reference numerals. When distinguishing a plurality of elements having a common reference numeral, the common reference numeral is distinguished by adding a subscript (for example, uppercase or lowercase letters of the alphabet).

In the following description, a nonvolatile semiconductor storage device according to an embodiment is, for example, a three-dimensional NAND flash memory. More specifically, it is a three-dimensional NAND flash memory in which a memory string and a bit line extend in the horizontal direction and a source line extends in the vertical direction.

First Embodiment

1. Configuration Example 1-1. Configuration of Memory System

FIG. 1 is a block diagram showing an example of a configuration of a memory system 3 including a nonvolatile semiconductor storage device 1 according to an embodiment. The configuration of the memory system 3 including the nonvolatile semiconductor storage device 1 according to the embodiment is not limited to the configuration shown in FIG. 1.

As shown in FIG. 1, the memory system 3 includes a nonvolatile semiconductor storage device 1 and an external controller 2. The memory system 3 is, for example, a memory card or the like such as a solid state drive (SSD) or an SD® card. The memory system 3 may include a host device (not shown). The external controller 2 controls a write operation, a read operation, and an erasing operation of the nonvolatile semiconductor storage device 1.

1-2. Configuration of Nonvolatile Semiconductor Storage Device

As shown in FIG. 1, the nonvolatile semiconductor storage device 1 includes an input/output circuit 10, a logic control circuit 11, a status register 12, an address register 13, a command register 14, a sequencer 15, a ready/busy circuit 16, a voltage generation circuit 17, a memory cell array 18, a row decoder 19, a sense amplifier module 20, a data register 21, and a column decoder 22.

The input/output circuit 10 controls an input (reception) of a signal DQ from the external controller 2 and an output (transmission) of a signal DQ to the external controller 2. The signal DQ includes, for example, data DAT, an address ADD, and a command CMD. More specifically, the input/output circuit 10 transmits the data DAT received from the external controller 2 to the data register 21, transmits the address ADD received from the external controller 2 to the address register 13, and transmits the command CMD received from the external controller 2 to the command register 14. Further, the input/output circuit 10 transmits to the external controller 2 the status information STS received from the status register 12, the data DAT received from the data register 21, the address ADD received from the address register 13, and the like.

The logic control circuit 11 receives various control signals from the external controller 2. The logic control circuit 11 controls the input/output circuit 10 and the sequencer 15 in response to the received control signal.

The status register 12 temporarily stores the status information STS in the write operation, the read operation, and the erasing operation, and notifies the external controller 2 whether or not each operation has normally ended.

The address register 13 temporarily stores the received address ADD. The address register 13 transfers the row address RADD to the row decoder 19 and transfers the column address CADD to the column decoder 22.

The command register 14 temporarily stores the received command CMD and transfers it to the sequencer 15.

The sequencer 15 controls the entire operation of the nonvolatile semiconductor storage device 1. More specifically, the sequencer 15 controls, for example, the status register 12, the ready/busy circuit 16, the voltage generation circuit 17, the row decoder 19, the sense amplifier module 20, the data register 21, the column decoder 22, and the like, in response to the received command CMD, and executes the write operation, the read operation, the erasing operation, and the like. In the embodiment, the sequencer 15 may be referred to as a "controller".

The ready/busy circuit 16 transmits a ready/busy signal RBn to the external controller 2 according to an operation status of the sequencer 15.

The voltage generation circuit 17 generates a voltage required for the write operation, the read operation, and the erasing operation according to the control of the sequencer 15, and supplies the generated voltage to, for example, the memory cell array 18, the row decoder 19, the sense amplifier module 20, and the like. The row decoder 19 and the sense amplifier module 20 apply the voltage supplied from the voltage generation circuit 17 to the memory cell transistor in the memory cell array 18.

The memory cell array 18 includes a plurality of blocks BLK (BLK0 to BLK3, . . . ) that include a plurality of nonvolatile memory cell transistors (hereinafter, also referred to as "memory cells") which are correlated with rows and columns. Each block BLK includes a plurality of string units SU (SU0, SU1, SU2, . . . ). The number of blocks BLK in the memory cell array 18 and the number of string units SU in the block BLK may be freely selected. The detailed configuration of the memory cell array 18 will be described later.

The row decoder 19 decodes the row address RADD. The row decoder 19 applies a required voltage to the memory cell array 18 based on the decoding result.

During the read operation, the sense amplifier module 20 senses the data (which is represented by the threshold voltage of the memory cell) read from the memory cell array 18 and transmits the sensed and read data to the data register 21. Further, during the write operation, the sense amplifier module 20 transmits the write data to the memory cell array 18.

The data register 21 includes a plurality of latch circuits. The latch circuit temporarily stores the write data or the read data.

The column decoder 22 decodes the column address CADD during, for example, the write operation, the read operation, and the erasing operation, and selects a latch circuit in the data register 21 according to the decoding result.

2. Configuration of Memory Cell Array

Figure 2:
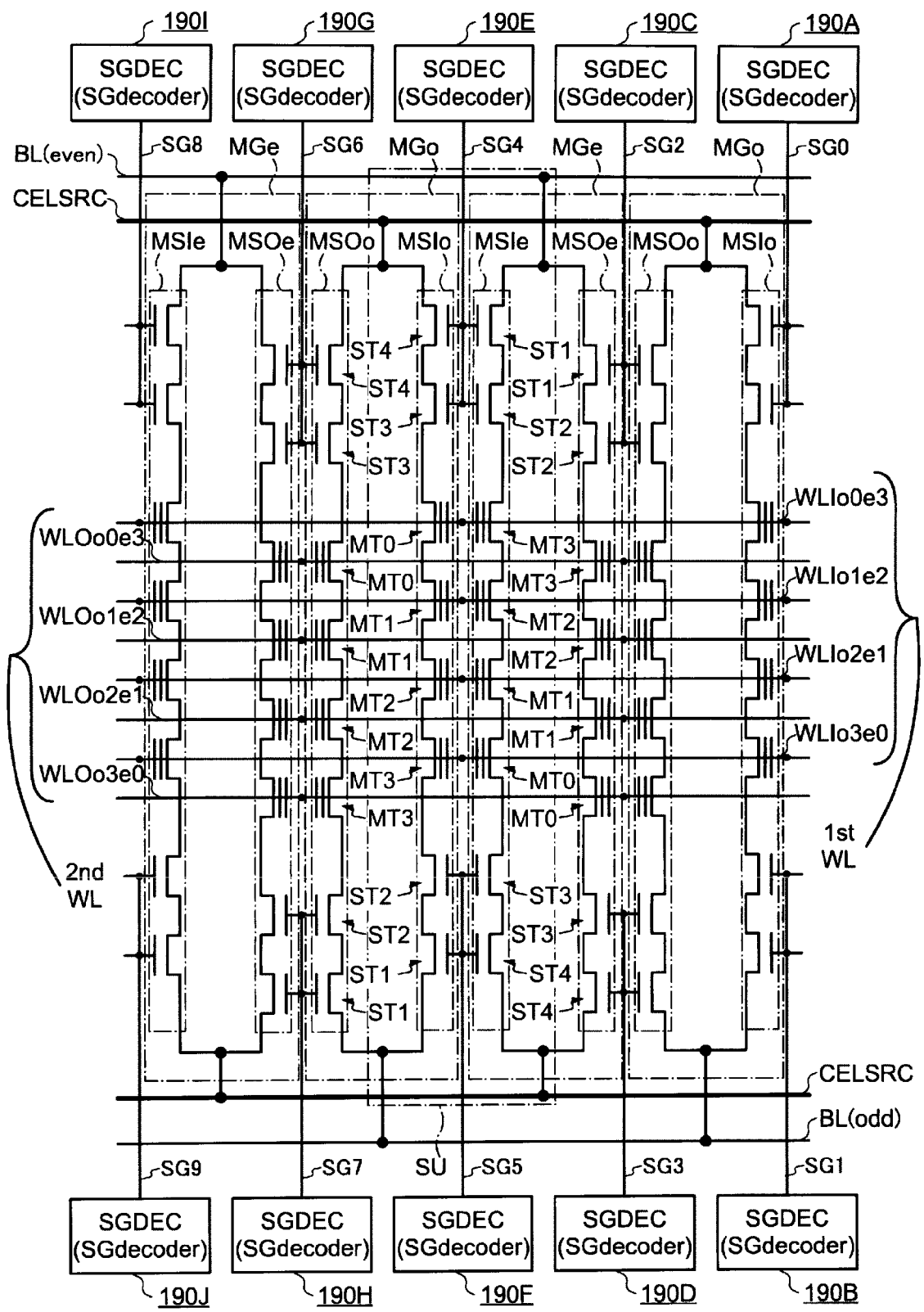
FIG. 2 is a circuit diagram showing a configuration of a circuit of a memory cell array provided in the nonvolatile semiconductor storage device according to the embodiment.
Figure 3:
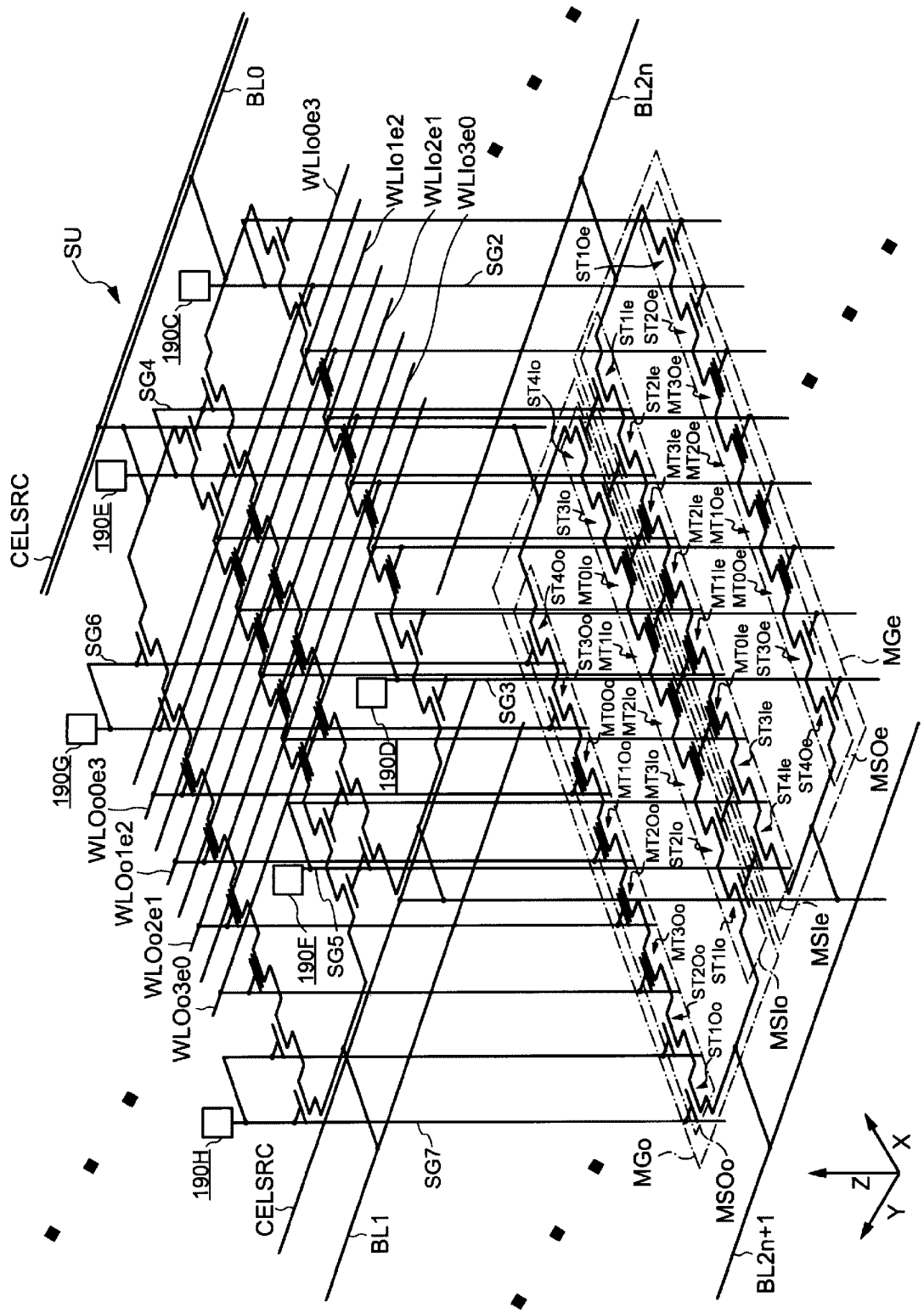
FIG. 3 is a diagram showing a configuration of a memory cell array provided in the nonvolatile semiconductor storage device according to the embodiment.

FIG. 2 is a circuit diagram showing an example of the memory cell array 18. FIG. 3 is a diagram showing an example of a configuration of the memory cell array 18. The configuration of the memory cell array 18 shown in FIGS. 2 and 3 is an example, and the configuration of the memory cell array 18 according to the embodiment is not limited to the configuration shown in FIGS. 2 and 3. Description of the same or similar configuration as in FIG. 1 may be omitted.

As described above, the memory cell array 18 (FIG. 1) includes the plurality of blocks BLK (FIG. 1), each block BLK includes the plurality of string units SU (FIG. 1), and each string unit SU includes a plurality of memory strings MSI arranged in the Z direction or a plurality of memory strings MSO arranged in the Z direction. In other words, each of the string units SU in the present embodiment is defined along the Z direction. The corresponding memory string MSI and memory string MSO at a certain location in the Z direction form a memory group MG (which is a memory string pair).

Figure 4:
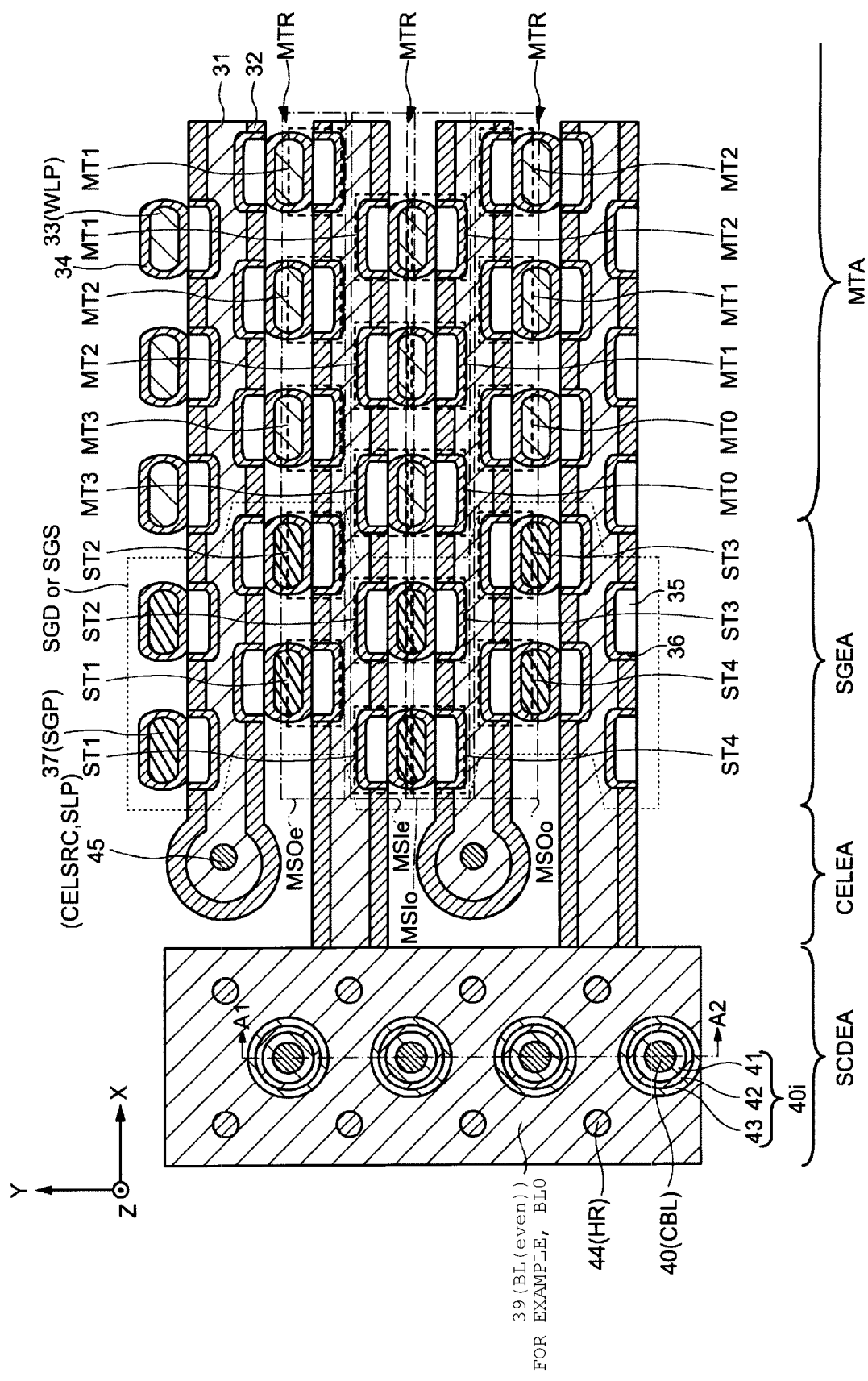
FIG. 4 is a diagram showing a planar layout of a select gate line, a source line, a select transistor, and a memory cell transistor corresponding to an even-numbered bit line in the nonvolatile semiconductor storage device according to the embodiment.

As shown in FIG. 2, one memory group MG includes two memory strings MSI and MSO. Each of the two memory strings MSI and MSO has a select transistor ST1, a select transistor ST2, memory cell transistors MT3 to MT0, a select transistor ST3, and a select transistor ST4, which are electrically connected in series. The memory string MSI and the memory string MSO face each other. In the example of FIG. 4, the select transistor ST1, the select transistor ST2, the memory cell transistors MT3 to MT0, the select transistor ST3, and the select transistor ST4, which are provided in the memory string MSI, are shifted in the X direction from locations facing the select transistor ST1, the select transistor ST2, the memory cell transistors MT3 to MT0, the select transistor ST3, and the select transistor ST4, which are provided in the memory string MSO, respectively. This arrangement of the select transistor ST1, the select transistor ST2, the memory cell transistors MT3 to MT0, the select transistor ST3, and the select transistor ST4, which are provided in the memory string MSI, and the select transistor ST1, the select transistor ST2, the memory cell transistors MT3 to MT0, the select transistor ST3, and the select transistor ST4, which are provided in the memory string MSO, is referred to as a staggered arrangement.

In the nonvolatile semiconductor storage device 1 according to the embodiment, two select transistors (select transistor ST1 and select transistor ST2) are provided on the bit line BL side. Further, two select transistors (select transistor ST3 and select transistor ST4) are provided on the source line CELSRC side. The configuration of the select transistor in the nonvolatile semiconductor storage device 1 according to the embodiment is not limited to the configuration shown in FIGS. 2 and 3. For example, the select transistor provided on the bit line BL side may be the select transistor ST1 or the select transistor ST2, and the select transistor provided on the source line CELSRC side may be the select transistor ST3 or the select transistor ST4. In the nonvolatile semiconductor storage device 1 according to the embodiment, the area of the memory cell array 18 can be reduced by reducing the number of select transistors.

In the memory cell array 18 of the nonvolatile semiconductor storage device 1 according to the embodiment, as shown in FIG. 2, two memory strings MSI and MSO in the same memory group MG are connected to the same bit line BL and the same source line CELSRC. The bit line BL extends in the Y direction (FIG. 3). In the embodiment, the X direction intersects the Y direction and the Z direction intersects the X and Y directions. The X, Y, and Z directions may be referred to herein as first, second, and third directions, respectively.

Further, an even-numbered bit line BL (even) and an odd-numbered bit line BL (odd) are on opposite sides of the memory cells. For example, the even-numbered bit line BL (even) and the odd-numbered bit line BL (odd) are on opposite sides of the memory cells in the X direction (FIG. 3).

As shown in FIG. 2, similarly to the bit line BL, a source line CELSRC connected to the even-numbered bit lines BL (even) via the MG and a source line CELSRC connected to the odd-numbered bit line BL (odd) via the MG are on opposite sides of the memory cells. For example, the source line CELSRC corresponding to the even-numbered bit line BL (even), and the source line CELSRC corresponding to the odd-numbered bit line BL (odd) are on opposite sides of the memory cells in the X direction (FIG. 3).

Further, the source line CELSRC corresponding to the even-numbered bit line BL (even) is provided on the odd-numbered bit line BL (odd) side with respect to the X direction, and the source line CELSRC corresponding to the odd-numbered bit line BL (odd) is provided on the even-numbered bit line BL (even) side with respect to the X direction.

In the nonvolatile semiconductor storage device 1 according to the embodiment, the memory group MG electrically connected to the even-numbered bit line BL (even) is referred to as the memory group MGe and the memory group MG electrically connected to the odd-numbered bit line BL (odd) is referred to as the memory group MGo. Further, the two memory strings MS in the memory group MGe are referred to as memory strings MSIe and MSOe, and the two memory strings MS in the memory group MGo are referred to as memory strings MSIo and MSOo.

The memory group MGe is provided adjacent to the memory group MGo. Further, the memory group MGe and the memory group MGo are provided, for example, substantially symmetric or symmetric with respect to the Y direction (FIG. 3). As described above, the even-numbered bit line BL (even) and the odd-numbered bit line BL (odd) are on opposite sides of the memory cells with respect to the X direction, the source line CELSRC corresponding to the even-numbered bit line BL (even) is provided on the odd-numbered bit line BL (odd) side with respect to the X direction, and the source line CELSRC corresponding to the odd-numbered bit line BL (odd) is provided on the even-numbered bit line BL (even) side with respect to the X direction. Further, in the memory group MGe, the memory group MGo adjacent to the left side of the memory group MGe, and the memory group MGo adjacent to the right side of the memory group MGe, the memory strings MSI, which belong to the memory group MGe and the memory group MGo adjacent to the left side of the memory group MGe, belong to the same string unit SU, and the memory strings MSO, which belong to the memory group MGe and the memory group MGo adjacent to the right side of the memory group MGe, belong to the same string unit SU. For example, the memory string MSIe that belongs to the memory group MGe and the memory string MSIo that belongs to the memory group MGo adjacent to the left side of the memory group MGe constitute one string unit SU, and the memory string MSOo that belongs to the memory group MGo adjacent to the right side of the memory group MGe and the memory string MSOe that belongs to the memory group MGe constitute another one string unit SU.

As a result, each transistor electrically connected in order from the even-numbered bit line BL (even) side toward the source line CELSCR side in the memory group MGe is symmetric to each transistor electrically connected in order from the source line CELSCR side to the odd-numbered bit line BL (odd) side in the memory group MGo. That is, each of the select transistor ST1, the select transistor ST2, the memory cell transistors MT3 to MT0, the select transistor ST3, and the select transistor ST4 in the memory strings MSIe in the memory group MGe is symmetric to the select transistor ST4, the select transistor ST3, the memory cell transistors MT3 to MT0, the select transistor ST2, and the select transistor ST1 in the memory strings MSIo in the memory group MGo. Further, each of the select transistor ST1, the select transistor ST2, the memory cell transistors MT3 to MT0, the select transistor ST3, and the select transistor ST4 in the memory string MSOe in the memory group MGe is symmetric to the select transistor ST4, the select transistor ST3, the memory cell transistors MT3 to MT0, the select transistor ST2, and the select transistor ST1 in the memory string MSOo in the memory group MGo.

In the nonvolatile semiconductor storage device 1 according to the embodiment, the memory group MGe and the memory group MGo are alternately and repeatedly arranged.

In the nonvolatile semiconductor storage device 1 according to the embodiment, an example including mainly two memory groups, the memory group MGe and the memory group MGo, will be described. The memory group MGe may be referred to as a "first semiconductor layer", the memory string MSIe provided in the memory group MGe may be referred to as a "first memory string", the memory cell transistors MT0 to MT3 in the first memory string may be referred to as "first memory cell transistors", the side on which the first memory string is provided may be referred to as a "first side", the memory string MSOe provided in the memory group MGe may be referred to as a "second memory string", the memory cell transistors MT0 to MT3 in the second memory string may be referred to as "second memory cell transistors", and the side on which the second memory string is provided may be referred to as a "second side". Similar to the memory group MGe, the memory group MGo may be referred to as a "second semiconductor layer", the memory string MSIo provided in the memory group MGo may be referred to as a "third memory string", the memory cell transistors MT0 to MT3 in the third memory string may be referred to as "third memory cell transistors", the side on which the third memory string is provided may be referred to as the "first side", the memory string MSOo provided in the memory group MGo may be referred to as a "fourth memory string", the memory cell transistors MT0 to MT3 in the fourth memory string may be referred to as "fourth memory cell transistors", and the side on which the fourth memory string is provided may be referred to as the "second side". It is noted that the second side is a side opposite to the first side with respect to the memory group MG.

The select transistors ST1 and ST2 of the memory string MSIe provided in the memory group MGe, and the select transistors ST3 and ST4 of the memory string MSIo provided in the memory group MGo are connected to a common select gate line SG4. The select transistors ST3 and ST4 of the memory string MSIe provided in the memory group MGe, and the select transistors ST1 and ST2 of the memory string MSIo provided in the memory group MGo are connected to a common select gate line SG5. The select transistors ST4 and ST3 of the memory string MSOo provided in the memory group MGo are connected to a select gate line SG6. The select transistors ST1 and ST2 of the memory string MSOo provided in the memory group MGo are connected to a select gate line SG7. The select transistors ST1 and ST2 of the memory string MSOe provided in the memory group MGe are connected to a select gate line SG2. The select transistors ST4 and ST3 of the memory string MSOe provided in the memory group MGe are connected to a select gate line SG3.

Each select gate line SG is electrically connected to a selection gate decoder (SG decoder (SGDEC)). Although not shown, the selection gate decoder receives a signal from, for example, the sequencer 15 or the voltage generation circuit 17, and a voltage is supplied. The selection gate decoder transmits a signal to the select gate line SG by using the received signal and the supplied voltage. As shown in FIG. 2, for example, the selection gate decoder 190A is electrically connected to the select gate line SG0 and transmits a signal to the select gate line SG0. Similarly, each of the selection gate decoders 190B, 190C, 190D, 190E, 190F, 190G, 190H, 190I, and 190J is electrically connected to the select gate lines SG1, SG3, SG2, SG4, SG5, SG6, SG7, SG9, and SG8 and transmits a signal to each signal line.

The memory cell transistor MT0 of the memory string MSIe provided in the memory group MGe and the memory cell transistor MT3 of the memory string MSIo provided in the memory group MGo are connected to a common word line WLIo3e0. The memory cell transistor MT1 of the memory string MSIe provided in the memory group MGe and the memory cell transistor MT2 of the memory string MSIo provided in the memory group MGo are connected to a common word line WLIo2e1. The memory cell transistor MT2 of the memory string MSIe provided in the memory group MGe and the memory cell transistor MT1 of the memory string MSIo provided in the memory group MGo are connected to a common word line WLIo1e2. The memory cell transistor MT3 of the memory string MSIe provided in the memory group MGe and the memory cell transistor MT0 of the memory string MSIo provided in the memory group MGo are connected to a common word line WLIo0e3.

The memory cell transistor MT0 of the memory string MSOe provided in the memory group MGe and the memory cell transistor MT3 of the memory string MSOo provided in the memory group MGo are connected to a common word line WLOo3e0. The memory cell transistor MT1 of the memory string MSOe provided in the memory group MGe and the memory cell transistor MT2 of the memory string MSOo provided in the memory group MGo are connected to a common word line WLOo2e1. The memory cell transistor MT2 of the memory string MSOe provided in the memory group MGe and the memory cell transistor MT1 of the memory string MSOo provided in the memory group MGo are connected to a common word line WLOo1e2. The memory cell transistor MT3 of the memory string MSOe provided in the memory group MGe and the memory cell transistor MT0 of the memory string MSOo provided in the memory group MGo are connected to a common word line WLOo0e3.

The common word line WLIo0e3, the word line WLIo1e2, the word line WLIo2e1, and the word line WLIo3e0, which are connected to the memory cell transistors MT3 to MT0 (first memory cell transistors) in the memory string MSIe (first memory string) provided in the memory group MGe and the memory cell transistors MT0 to MT3 (third memory cell transistors) in the memory string MSIo (third memory string) provided in the memory group MGo, are each referred to herein as a "first word line (1stWL)". The word line WLOo0e3, the word line WLOo1e2, the word line WLOo2e1, and the word line WLOo3e0, which are connected to the memory cell transistors MT3 to MT0 (second memory cell transistors) in the memory string MSOe (second memory string) provided in the memory group MGe and the memory cell transistors MT0 to MT3 (fourth memory cell transistors) in the memory string MSOo (fourth memory string) provided in the memory group MGo, are each referred to herein as a "second word line (2ndWL)".

As described above, the memory cell array 18 (FIG. 1) includes the plurality of blocks BLK (FIG. 1), and each block BLK includes the plurality of string units SU (FIG. 1). FIG. 3 shows a plurality of memory groups MG corresponding to semiconductor layers (FIG. 4 and FIG. 5) that are stacked in the Z direction and form each of the memory string MSI and the memory string MSO connected to each bit line BL (BL0, BL1, . . . , BL2n, BL2n+1). In the following, configurations of the memory string MSI and the memory string MSO corresponding to the semiconductor layer 31 (memory group MG) of any layer will be mainly described. It is noted that in the embodiment, a "semiconductor layer" may be referred to as a "channel layer".

As shown in FIG. 3, the memory cell array 18 includes the plurality of memory groups MG. More specifically, each of the semiconductor layers 31 (memory string MSI and memory string MSO) stacked in the Z direction includes a plurality of memory groups MG separated in the Y direction. As described above with reference to FIG. 2, each of the memory groups MG includes two memory strings MSI and MSO. In the following, when the memory strings MSI and MSO are not distinguished from each other, the memory string is referred to as a memory string MS.

The memory string MSIe includes, for example, two select transistors ST1Ie and ST2Ie provided on the select gate line SG side, four memory cell transistors MT3Ie to MT0Ie, and two select transistors ST3Ie and ST4Ie provided on the source line CELSRC side. The memory string MSOe includes, for example, two select transistors ST10e and ST20e provided on the select gate line SG side, four memory cell transistors MT30e to MT00e, and two select transistors ST30e and ST40e provided on the source line CELSRC side. The memory string MSIo includes, for example, two select transistors ST1Io and ST2Io provided on the select gate line SG side, four memory cell transistors MT3Io to MT0Io, and two select transistors ST3Io and ST4Io provided on the source line CELSRC side. The memory string MSOo is, for example, two select transistors ST1Oo and ST2Oo provided on the select gate line SG side, four memory cell transistors MT3Oo to MT0Oo, and two select transistors ST3Oo and ST4Oo provided on the source line CELSRC side. Hereinafter, when the memory cell transistors MT3Ie to MT0Ie, MT0Oe to MT30e, MT3Io to MT0Io, and MT0Oo to MT3Oo are not limited, they are referred to as a memory cell transistor MT.

The memory cell transistor MT includes a control gate and a charge storage layer, and stores data (which is represented by the threshold voltage) in a nonvolatile manner. It is noted that the memory cell transistor MT may be a MONOS type in which an insulating layer is used for the charge storage layer, or may be an FG type in which a conductive layer is used for the charge storage layer. In the embodiment shown below, the FG type will be described as an example. Further, the number of memory cell transistors MT in each of the memory strings MS may be, for example, 8, 16, 32, 48, 64, 96, or 128, and the number is not limited.

The current paths of the select transistor ST1Ie, the select transistor ST2Ie, the memory cell transistors MT3Ie to MT0Ie, the select transistor ST3Ie, and the select transistor ST4Ie in the memory string MSIe are connected in series. The current paths of the select transistor ST10e, the select transistor ST2Oe, the memory cell transistors MT30e to MT0Oe, the select transistor ST30e, and the select transistor ST40e in the memory string MSOe are connected in series.

The current paths of the select transistor ST1Io, the select transistor ST2Io, the memory cell transistors MT3Io to MT0Io, the select transistor ST3Io, and the select transistor ST4Io in the memory string MSIo are connected in series. The current paths of the select transistor ST1Oo, the select transistor ST2Oo, the memory cell transistors MT3Oo to MT0Oo, the select transistor ST3Oo, and the select transistor ST4Oo in the memory string MSOo are connected in series.

Figure 5:
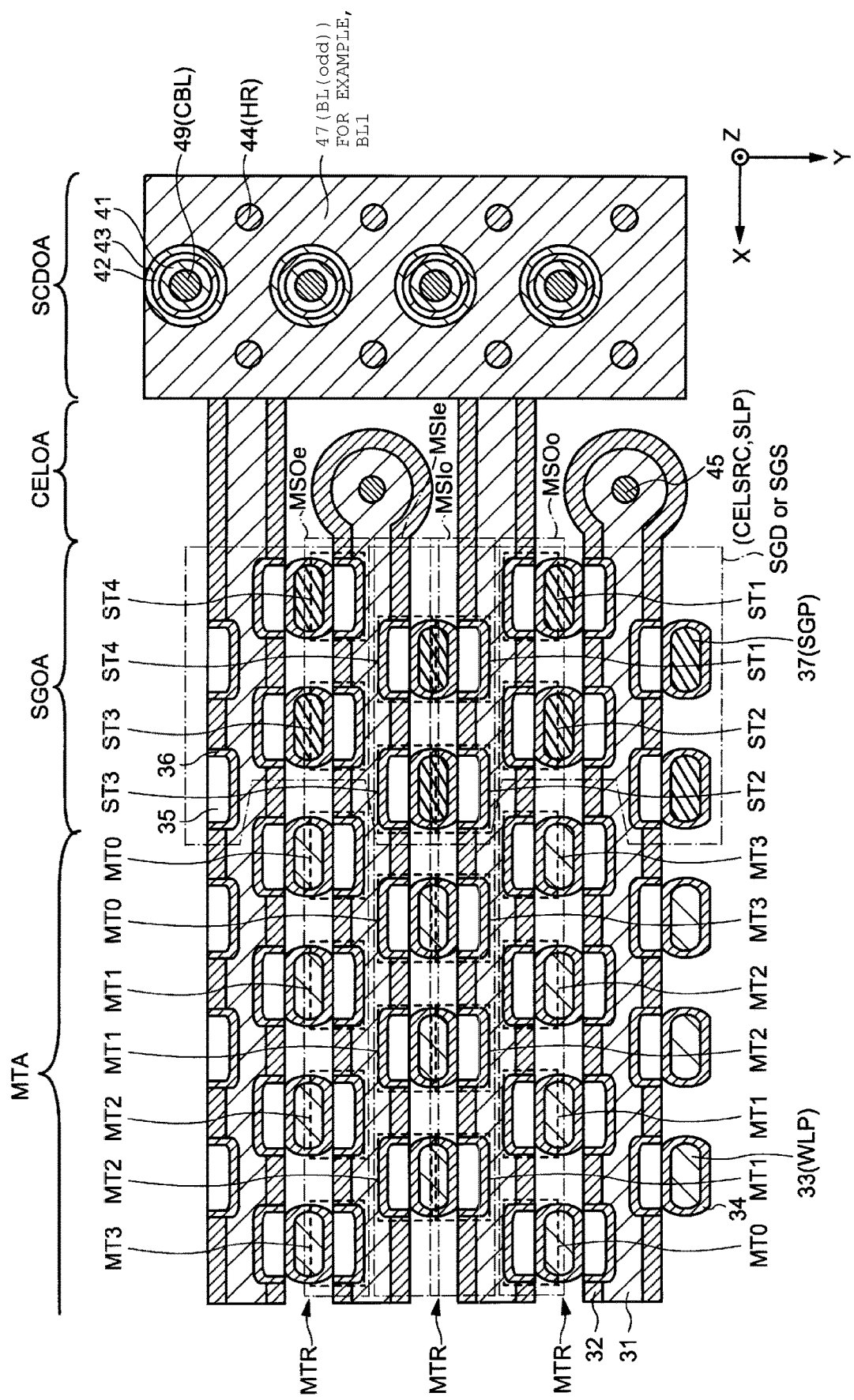
FIG. 5 is a diagram showing a planar layout of a select gate line, a source line, a select transistor, and a memory cell transistor corresponding to an odd-numbered bit line in the nonvolatile semiconductor storage device according to the embodiment.

Gates of the memory cell transistors MT in the plurality of memory groups MG arranged along the Z direction are commonly connected to one word line WL via a word line pillar WLP (depicted as conductive layer 33 in FIG. 4 and FIG. 5). More specifically, for example, the plurality of gates (gate electrodes) of the memory cell transistors MT0Io and the gates (gate electrodes) of the memory cell transistors MT3Ie of the plurality of memory groups MG arranged along the Z direction are commonly connected to a word line WLIo0e3. Similarly, the plurality of gates (gate electrodes) of the memory cell transistors MT1Io and the gates (gate electrodes) of the memory cell transistors MT2Ie of the plurality of memory groups MG arranged along the Z direction are commonly connected to a word line WLIo1e2, the plurality of gates (gate electrodes) of the memory cell transistors MT2Io and the gates (gate electrodes) of the memory cell transistors MT1Ie of the plurality of memory groups MG arranged along the Z direction are commonly connected to a word line WLIo2e1, the plurality of gates (gate electrodes) of the memory cell transistors MT3Io and the gates (gate electrodes) of the memory cell transistors MT0Ie of the plurality of memory groups MG arranged along the Z direction are commonly connected to a word line WLIo3e0, the plurality of gates (gate electrodes) of the memory cell transistors MT0Oo and the gates (gate electrodes) of the memory cell transistors MT30e of the plurality of memory groups MG arranged along the Z direction are commonly connected to a word line WLOo0e3, the plurality of gates (gate electrodes) of the memory cell transistors MT1Oo and the gates (gate electrodes) of the memory cell transistors MT2Oe of the plurality of memory groups MG arranged along the Z direction are commonly connected to a word line WLOo1e2, the plurality of gates (gate electrodes) of the memory cell transistors MT2Oo and the gates (gate electrodes) of the memory cell transistors MT1Oe of the plurality of memory groups MG arranged along the Z direction are commonly connected to a word line WLOo2e1, and the plurality of gates (gate electrodes) of the memory cell transistors MT3Oo and the gates (gate electrodes) of the memory cell transistors MT0Oe of the plurality of memory groups MG arranged along the Z direction are commonly connected to a word line WLOo3e0.

As shown in FIGS. 3-5, drains of the select transistors ST1 of the plurality of memory groups MG arranged along the Z direction are commonly connected to the bit line BL corresponding to each of the plurality of memory groups MG via the bit line contact CBL. For example, the drains of the select transistors ST1Ie and ST10e of the n-th layer memory group MGe are connected to the bit line BL2n, and the drains of the select transistors ST1Io and ST1Oo of the n-th layer memory group MGo are connected to the bit line BL2n+1.

The sources of the select transistors ST4 of the plurality of memory groups MG arranged along the Z direction are commonly connected to the source lines CELSRC via the source line pillars SLP (depicted as conductive layer 45 in FIG. 4 and FIG. 5). For example, the sources of the select transistors ST4Ie and ST40e of the memory group MGe in the n-th semiconductor layer 31 are commonly connected to the source line CELSRC on the bit line BL2n+1 side. The sources of the select transistors ST4Io and ST4Oo of the memory group MGo in the n-th semiconductor layer 31 are commonly connected to the source line CELSRC on the bit line BL2n side.

Further, the gate electrodes of the select transistors ST1 and ST2, and the select transistors ST3 and ST4 of the plurality of memory groups MG aligned along the Z direction are commonly connected to the select gate lines SG, which are different from each other, via the select gate line pillars SGP (depicted as conductive layer 37 in FIG. 4 and FIG. 5). For example, the gate electrodes of the select transistors ST10e and ST20e of the memory group MGe respectively provided in the plurality of wiring layers 31 aligned along the Z direction are commonly connected to the select gate line SG2. The gate electrodes of the select transistors ST40e and ST30e of the memory group MGo respectively provided in the plurality of wiring layers 31 aligned along the Z direction are commonly connected to the select gate line SG3. The gate electrodes of the select transistors ST1Ie and ST2Ie of the memory group MGe, and the gate electrodes of the select transistors ST4Io and ST3Io of the memory group MGe, which are respectively provided in the plurality of wiring layers 31 aligned along the Z direction are commonly connected to the select gate line SG4. The gate electrodes of the select transistors ST4Ie and ST3Ie of the memory group MGe, and the gate electrodes of the select transistors ST1Io and ST2Io of the memory group MGo, which are respectively provided in the plurality of wiring layers 31 aligned along the Z direction are commonly connected to the select gate line SG5. The gate electrodes of the select transistors ST1Oo and ST2Oo of the memory group MGo respectively provided in the plurality of wiring layers 31 aligned along the Z direction are commonly connected to the select gate line SG7. The gate electrodes of the select transistors ST4Oo and ST3Oo of the memory group MGo respectively provided in the plurality of wiring layers 31 aligned along the Z direction are commonly connected to the select gate line SG6.

Figure 7:
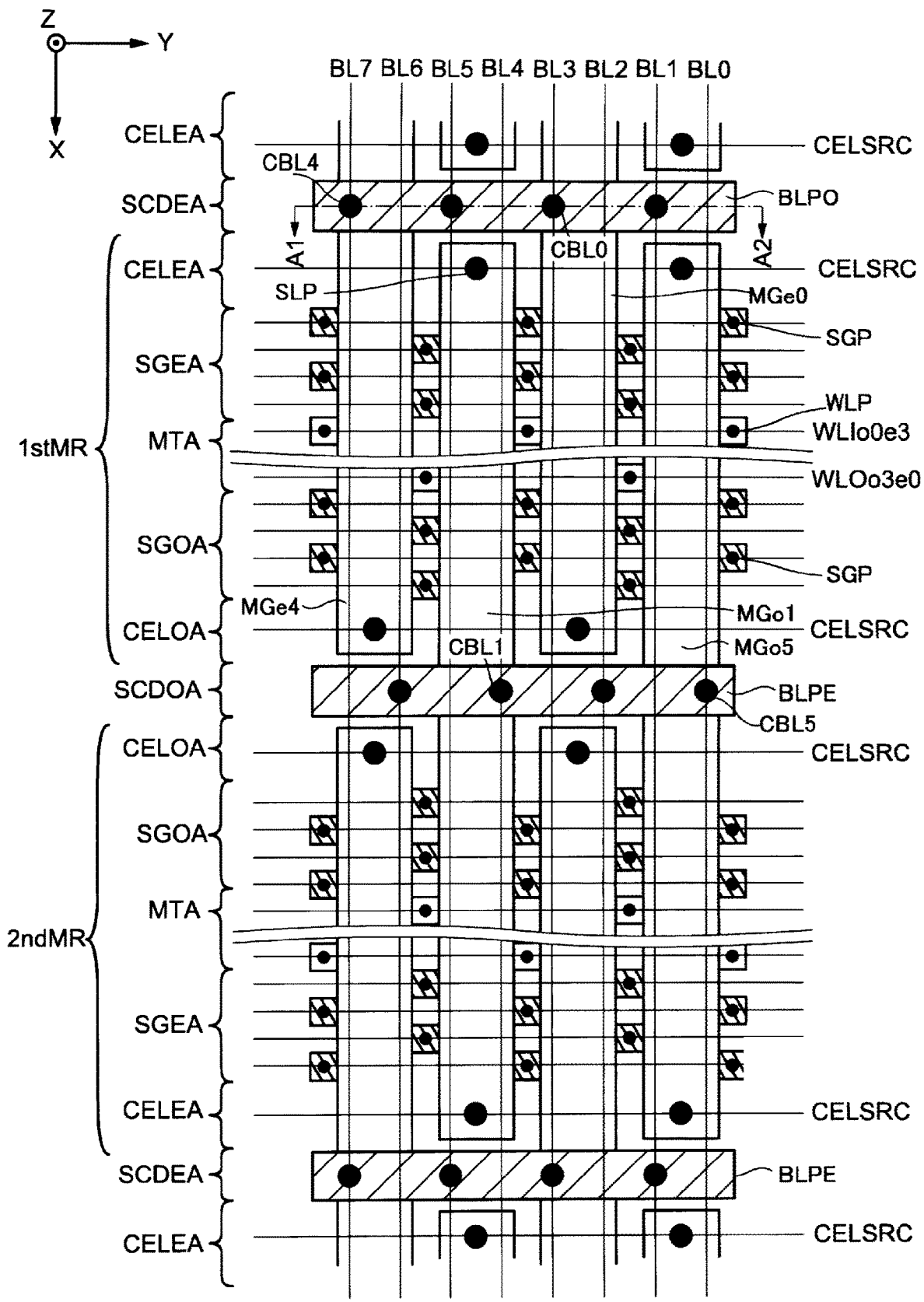
FIG. 7 is a diagram showing a configuration of the select gate line, the bit line, and the source line provided in the nonvolatile semiconductor storage device shown in FIG. 4.

In the nonvolatile semiconductor storage device 1 according to the embodiment, the plurality of memory groups MG arranged along the Z direction shown in FIG. 3 are also arranged along the X direction and the Y direction. Although details will be described later, for example, the nonvolatile semiconductor storage device 1 according to the embodiment includes, as shown in FIG. 7, a first memory configuration MR (depicted as 1stMR) and a second memory configuration MR (depicted as 2ndMR) arranged adjacent to the first memory configuration MR1 along the X direction, by using the plurality of memory groups MG aligned along the Z direction shown in FIG. 3 as one memory configuration (such a configuration referred to herein as a memory ridge).

As shown in FIGS. 1 to 3, in the nonvolatile semiconductor storage device 1 according to the embodiment, the bit line BL0 extends in the Y direction intersecting the X direction. The bit line BL1 extends in the Y direction and is provided on the side opposite to the bit line BL0 with respect to the X direction and in parallel with the bit line BL0. A first source line CELSRC provided on the bit line BL0 side and a second source line CELSRC provided on the bit line BL1 side extend in the Z direction intersecting the X direction and the Y direction. The second source line CELSRC is provided in parallel to the first source line CELSRC, and the second source line CELSRC is provided on the side opposite to the first source line CELSRC with respect to the X direction. The memory group MGe extends in the X direction, and the memory group MGo extends in the X direction at a location spaced apart from the memory group MGe in the second direction. The memory string MSIe in the memory group MGe is provided on the first side of the memory group MGe and includes the select transistor ST1Ie that is electrically connected to the bit line BL0, the select transistor ST4Ie that is electrically connected to the source line CELSRC provided on the bit line BL1 side, and the memory cell transistors MT3Ie to MT0Ie that are electrically connected between the select transistor ST1Ie and the select transistor ST4Ie. The memory string MSOe in the memory group MGe is provided on the second side of the memory group MGe and includes the select transistor ST10e that is electrically connected to the bit line BL0, the select transistor ST40e that is electrically connected to the source line CELSRC provided on the bit line BL1 side, and the memory cell transistors MT30e to MT0Oe that are electrically connected between the select transistor ST10e and the select transistor ST40e. The memory string MSIo in the memory group MGo is provided on the first side of the memory group MGo and includes the select transistor ST1Io that is electrically connected to the bit line BL1, the select transistor ST4Io that is electrically connected to the source line CELSRC provided on the bit line BL0 side, and the memory cell transistors MT3Io to MT0Io that are electrically connected between the select transistor ST1Io and the select transistor ST4Io. The memory string MSOo is provided on the second side of the memory group MGo and includes the select transistor ST1Oo that is electrically connected to bit line BL1, the select transistor ST4Oo that is electrically connected to the source line CELSRC provided on the bit line BL0 side, and the memory cell transistors MT3Oo to MT0Oo that are electrically connected between the select transistor ST1Oo and the select transistor ST4Oo. The gate electrode of the select transistor ST1Ie and the gate electrode of the select transistor ST4Io are electrically connected to the select gate line SG4, and the gate electrode of the select transistor ST4Ie and the gate electrode of the select transistor ST1Io are electrically connected to the select gate line SG5.

3. Planar Layout of Memory Cell Region, Selection Gate Region, Source Region, Step Contact Region FIG. 4 is an example of a plan view showing a memory cell region MTA of a memory cell array 18, a selection gate region SGEA, a source region CELEA, and a step contact region SCDEA corresponding to an even-numbered bit line BL (even). FIG. 5 is an example of a plan view showing a memory cell region MTA of a memory cell array 18, a selection gate region SG0A, a source region CELOA, and a step contact region SCDOA corresponding to an odd-numbered bit line BL (odd). FIG. 4 is an example of a layout diagram from the bit line BL0 to the memory cell MT1 in FIG. 3, and FIG. 5 is an example of a layout diagram from the memory cell MT3 to the bit line BL1 in FIG. 3. It is noted that the configuration of the memory cell array 18 shown in FIGS. 4 and 5 is an example, and the configuration of the memory cell array 18 is not limited to the configuration shown in FIGS. 4 and 5. Descriptions of configurations that are the same as or similar to those in FIGS. 1 to 3 may be omitted.

As shown in FIGS. 4 and 5, a memory trench MTR is provided between the two semiconductor layers 31 arranged along the Y direction. An insulating layer (not shown) is embedded in the memory trench MTR.

In the memory cell region MTA and the selection gate regions SGEA and SG0A, an insulating layer 32 is provided on the side surface of the semiconductor layer 31. The insulating layer 32 functions as an etch stopper when forming the insulating layer 36 (which is a tunnel insulating film) and the charge storage layer 35, which will be described later.

In the memory cell region MTA and the selection gate regions SGEA and SG0A, a plurality of word line pillars WLP and a plurality of select gate line pillars SGP are provided so as to separate the memory trench MTR. The word line pillar WLP and the select gate line pillar SGP include a conductive layer 33 extending in the Z direction and an insulating layer 34 in contact with the side surface of the conductive layer 33. The conductive layer 33 functions as a contact plug CWL. The insulating layer 34 functions as a block insulating film of the memory cell transistor MT.

In the Y direction, a charge storage layer 35 and an insulating layer 36 are provided between the word line pillar WLP and the select gate line pillar SGP, and the semiconductor layer 31 so as to separate the insulating layer 32. The insulating layer 36 functions as a tunnel insulating film. More specifically, in the XY plane, one side surface of the charge storage layer 35 along the Y direction contacts the insulating layer 34 of the word line pillar WLP and the select gate line pillar SGP, and the other side surface (the other side surface along the Y direction and the two side surfaces along the X direction) are in contact with the insulating layer 36. Apart of the side surface of the insulating layer 36 along the Y direction is in contact with the semiconductor layer 31 and the insulating layer 32.

Therefore, between the conductive layer 33 or 37 and the semiconductor layer 31, the insulating layer 34, the charge storage layer 35, and the insulating layer 36 are formed in this order from the conductive layer 33 toward the semiconductor layer 31. A region (also referred to as an intersection region between the semiconductor layer 31 and the word line pillar WLP or the semiconductor layer 31 and the select gate line pillar SGP) including a part of the semiconductor layer 31, a part of the conductive layer 33 or 37, a part of the insulating layer 34, the charge storage layer 35, and the insulating layer 36 functions as the memory cell transistor MT or the select transistor ST.

As shown in FIG. 4, in one semiconductor layer 31 connected to the conductive layer 39 that functions as an even-numbered bit line BL (even), the intersection region between the semiconductor layer 31 and the word line pillar WLP provided therebelow (as depicted in FIG. 4) functions as the memory cell transistors MT3 to MT1 of the memory string MSIe, the intersection region between the semiconductor layer 31 and the select gate line pillar SGP provided therebelow (as depicted in FIG. 4) functions as the select transistors ST1 and ST2 of the memory string MSIe, the intersection region between the semiconductor layer 31 and the word line pillar WLP provided thereabove (as depicted in FIG. 4) functions as the memory cell transistors MT3 to MT1 of the memory string MSOe, and the intersection region between the semiconductor layer 31 and the select gate line pillar SGP provided thereabove (as depicted in FIG. 4 functions as the select transistors ST1 and ST2 of the memory string MSOe. Similarly, in another one semiconductor layer 31 connected to the source line CELSRC (electrically connected to conductive layer 45 depicted in FIG. 4), the intersection region between the semiconductor layer 31 and the word line pillar WLP provided therebelow (as depicted in FIG. 4) functions as the memory cell transistors MT0 to MT2 of the memory string MSOo, the intersection region between the semiconductor layer 31 and the select gate line pillar SGP provided therebelow (as depicted in FIG. 4) functions as the select transistors ST4 and ST3 of the memory string MSOo, the intersection region between the semiconductor layer 31 and the word line pillar WLP provided thereabove (as depicted in FIG. 4) functions as the memory cell transistors MT0 to MT2 of the memory string MSIo, and the intersection region between the semiconductor layer 31 and the select gate line pillar SGP provided thereabove (as depicted in FIG. 4) functions as the select transistors ST4 and ST3 of the memory string MSIo.

As shown in FIG. 5, in one semiconductor layer 31 connected to the source line CELSRC (electrically connected to conductive layer 45 depicted in FIG. 5), the intersection region between the semiconductor layer 31 and the word line pillar WLP provided therebelow (as depicted in FIG. 5 functions as the memory cell transistors MT2 to MT0 of the memory string MSIe, the intersection region between the semiconductor layer 31 and the select gate line pillar SGP provided therebelow (as depicted in FIG. 5) functions as the select transistors ST3 and ST4 of the memory string MSIe, the intersection region between the semiconductor layer 31 and the word line pillar WLP provided thereabove (as depicted in FIG. 5) functions as the memory cell transistors MT3 to MT0 of the memory string MSOe, and the intersection region between the semiconductor layer 31 and the select gate line pillar SGP provided thereabove (as depicted in FIG. 5) functions as the select transistors ST3 and ST4 of the memory string MSOe. Similarly, in another semiconductor layer 31 connected to the conductive layer 47 that functions as an odd-numbered bit line BL (odd), the intersection region between the semiconductor layer 31 and the word line pillar WLP provided therebelow (as depicted in FIG. 5) functions as the memory cell transistors MT0 to MT3 of the memory string MSOo, the intersection region between the semiconductor layer 31 and the select gate line pillar SGP provided therebelow (as depicted in FIG. 5) functions as the select transistors ST2 and ST1 of the memory string MSOo, the intersection region between the semiconductor layer 31 and the word line pillar WLP provided thereabove (as depicted in FIG. 5) functions as the memory cell transistors MT1 to MT3 of the memory string MSIo, and the intersection region of the semiconductor layer 31 and the select gate line pillar SGP provided thereabove (as depicted in FIG. 5) functions as the select transistors ST2 and ST1 of the memory string MSIo.

In the source line region CELEA shown in FIG. 4 and the source line region CELOA shown in FIG. 5, the semiconductor layer 31 is surrounded by an insulating layer 32, and a conductive layer 45 penetrating the semiconductor layer 31 is provided. The conductive layer 45 is a source line pillar SLP. The conductive layer 45 functions as a source line contact plug and is electrically connected to the source line CELSRC. In the example shown in FIG. 4, the semiconductor layer 31 has a shape with a circular shape in the connection region with the conductive layer 45. It is noted that any shape may be used for the shape of the semiconductor layer 31 in the connection region with the conductive layer 45. For example, the shape of the connection region may be a polygonal shape. The connection region may have a shape so that a sufficient margin of the semiconductor layer 31 can be secured on the XY plane around the hole for the source line pillar SLP in view of manufacturing variations or the like when processing the hole for the source line pillar SLP that penetrates the semiconductor layer 31.

As shown in FIG. 4, in the step contact region SCDEA, the conductive layer 40 and the insulating layer 44 penetrating the conductive layer 39 are provided. The conductive layer 40 functions as a contact plug CBL. The insulating layer 44 functions as a dummy pillar HR. The conductive layer 40 is electrically connected to any one of the conductive layer 39 stacked in the Z direction. An insulating layer 40i is formed between the conductive layer 39 and the conductive layer 40 which are not electrically connected. The insulating layer 40i includes an insulating layer 41, an insulating layer 42, and an insulating layer 43. The insulating layer 41 is in contact with the side surface (hereinafter, also referred to as an "outer surface") of the conductive layer 40. The insulating layer 42 is in contact with a part of the outer surface of the insulating layer 41. The insulating layer 43 is in contact with the outer surface of the insulating layer 42.

As shown in FIG. 5, in the step contact region SCDOA, the conductive layer 49 and the insulating layer 44 penetrating the conductive layer 47 are provided. The conductive layer 49 functions as a contact plug CBL. Similar to FIG. 4, the insulating layer 44 functions as a dummy pillar HR. The conductive layer 49 is electrically connected to any one of the conductive layer 47 stacked in the Z direction. An insulating layer 43, an insulating layer 42, and an insulating layer 41 are provided between the conductive layer 47 and the conductive layer 49 which are not electrically connected. The insulating layer 41 is in contact with the side surface (hereinafter, also referred to as an "outer surface") of the conductive layer 49. The insulating layer 42 is in contact with a part of the outer surface of the insulating layer 41. The insulating layer 43 is in contact with the outer surface of the insulating layer 42.

A conductive material is used for the conductive layer 39 and the conductive layer 47. The conductive material may be, for example, a metal material or a semiconductor such as Si to which impurity is added. The semiconductor such as Si to which impurity is added may be polysilicon to which phosphorus (P) is added. A conductive material is used for the conductive layer 40 and the conductive layer 49. The conductive material may be, for example, a metal material, and more specifically, W and TiN may be used.

4. End Face Structure of Cut Portion of Step Contact Region

Figure 6:
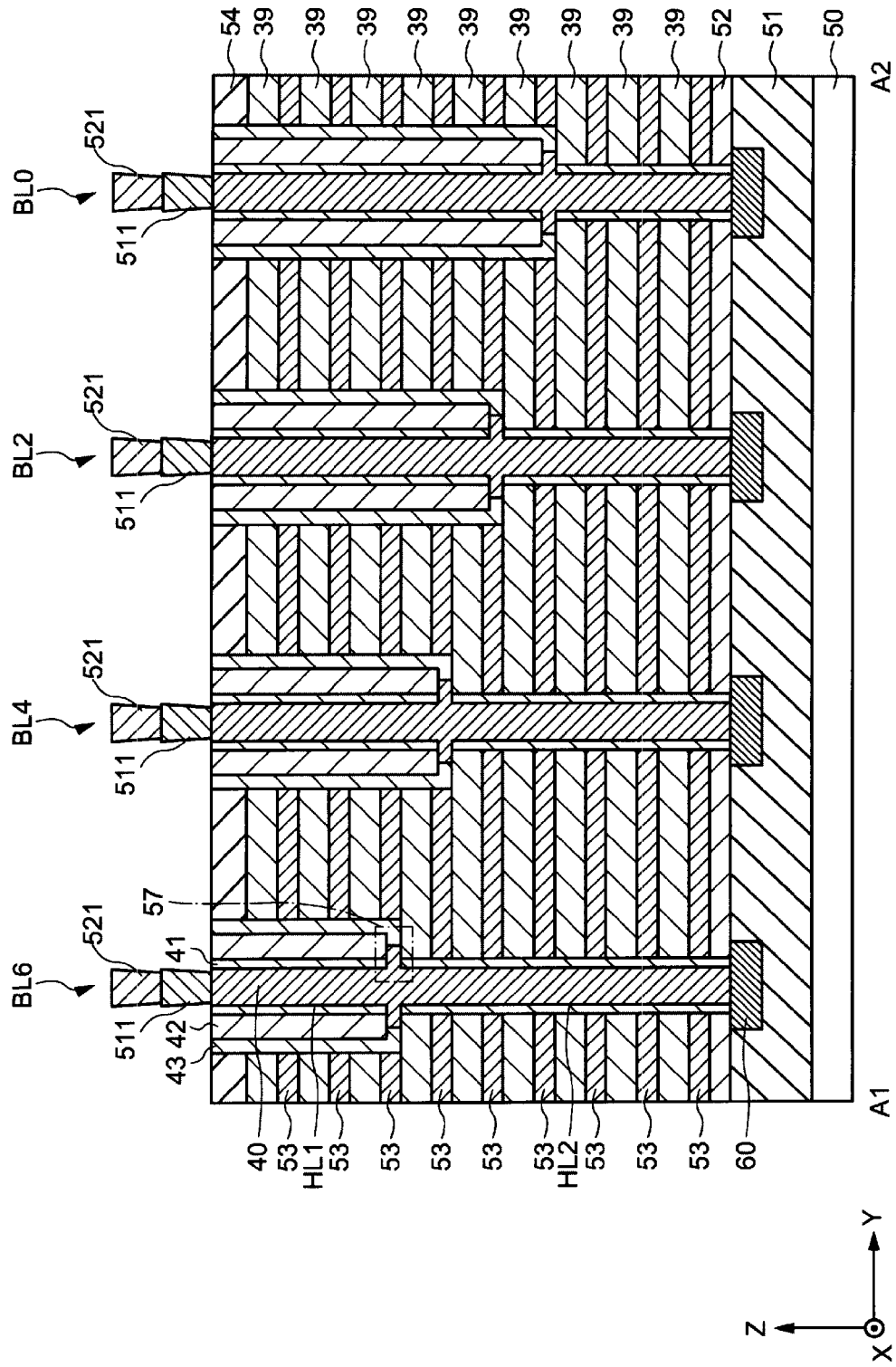
FIG. 6 is an end face view of a cross-section of the nonvolatile semiconductor storage device taken along line A1-A2 in FIG. 4.

FIG. 6 is an example of an end face view of a cross-section taken of the step contact region SCDEA of the memory cell array 18 taken along line A1-A2 in FIG. 4. The end face structure of the cross-section shown in FIG. 6 is an example, and the end face structure of the cross-section of the memory cell array 18 of the nonvolatile semiconductor storage device according to the embodiment is not limited to the example shown in FIG. 6. Descriptions of configurations that are the same as or similar to those in FIGS. 1 to 5 may be omitted.

FIG. 6 shows a state in which the conductive layer 39 functioning as the even-numbered bit line BL (even) is provided in a stepped manner. As shown in FIG. 6, the insulating layer 51 is provided on a semiconductor substrate 50. A silicon oxide ($SiO_2$) is used for the insulating layer 51, for example. Inside the insulating layer 51, a transistor (not shown) that is formed on the semiconductor substrate 50 and a plurality of wiring layers (not shown) are provided. A memory cell array 18 is provided on the insulating layer 51.

A plurality of conductive layers 60 extending in the X direction are formed in the vicinity of the upper surface of the insulating layer 51. The conductive layer 60 functions as, for example, a wiring that connects the bit line BL and each wiring. A metal material, a semiconductor to which impurity is added, or the like is used for the conductive layer 60, for example.

An insulating layer 52 is provided on the insulating layer 51. The insulating layer 52 functions as an etch stopper when processing a hole used in the memory trench MT, various contact plug, and the like. The insulating layer 52 may be an insulating material capable of obtaining a sufficient etch selection ratio with respect to the insulating layer 53 provided on an upper layer of the insulating layer 52. A silicon nitride (SiN), metal oxide, aluminum oxide ($Al_2O_3$), or the like is used for the insulating layer 52, for example.

An insulating layer 53 is provided on the insulating layer 52. $SiO_2$ is used for the insulating layer 53, for example. On the insulating layer 53, for example, the conductive layers 39 with nine layers are stacked with an insulating layer 53 is interposed therebetween. That is, on the insulating layer 52, for example, the insulating layers 53 with nine layers and the conductive layers 39 with nine layers are alternately stacked. The conductive layer 39 is formed in the same layer as the semiconductor layer 31 (see FIG. 4 and FIG. 5). That is, on the insulating layer 53, for example, nine layers of the semiconductor layers 31 are stacked with an insulating layer 53 is interposed therebetween. It is noted that the number of layers in the stack of the semiconductor layers 31 and the conductive layers 39 may be freely selected.

An insulating layer 54 is formed on the uppermost conductive layer 39. $SiO_2$ is used for the insulating layer 54, for example.

A plurality of holes HL1 are provided which penetrate the insulating layer 54 and reach one of the conductive layers 39. One or more holes HL1 are provided on each conductive layer 39. The number of holes HL1 is equal to or greater than the number of layers of the conductive layers 39. FIG. 6 shows the hole HL1 whose bottom surface reaches the conductive layer 39, which is the fourth layer from the upper layer, the hole HL1 whose bottom surface reaches the conductive layer 39, which is the fifth layer from the upper layer, the hole HL1 whose bottom surface reaches the conductive layer 39, which is the sixth layer from the upper layer, and the hole HL1 whose bottom surface reaches the conductive layer 39, which is the seventh layer from the upper layer.

The insulating layer 43 is provided on a part of the side surface and the bottom surface of the hole HL1. SiN is used for the insulating layer 43, for example. Further, the insulating layer 42 whose side surface contacts the insulating layer 43 is provided in the hole HL1. $SiO_2$ is used for the insulating layer 42, for example.

A hole HL2 is provided which penetrates the hole HL1 and whose bottom surface reaches the conductive layer 60. The insulating layer 41 is provided on a part of the side surface of the hole HL2. The conductive layer 40 is provided inside the hole HL2. Since the conductive layer 40 is a layer connecting a plurality of layers, the conductive layer 40 functions as a hook up (HU) layer. In the embodiment, the conductive layer 40 functions as a contact plug CBL for the bit line BL.

In the vicinity of the bottom surface of the hole HL1, the insulating layer 41 in the same layer as a part of the insulating layer 43 is removed. A connection portion 57, which is protruded on the side surface in the conductive layer 40, is provided. The bottom surface of the connection portion 57 is connected to the conductive layer 39. That is, the bottom surface of the conductive layer 40 is electrically connected to the conductive layer 60, and is electrically connected to the conductive layer 39 (bit line BL) of one of the layers via the protruding connection portion 57. For example, the height location of the upper surface of the connection portion 57 is lower than the bottom surface of the conductive layer 39 provided above.

The conductive layer 40 is connected to the conductive layer 511 and is connected to each bit line BL via the conductive plug 521. In this way, each bit line BL is connected to the contact plug CBL. Although FIG. 4 shows only the state in which the bit line BL0 and the conductive layer 39 are connected, similar to bit line BL0, the other bit lines BL2, BL4, and BL6 are also connected to the conductive layer 39 via the corresponding conductive layer and the conductive plug, respectively. As shown in FIG. 6, for example, the conductive layer 39, which is the fourth layer from the upper layer, is electrically connected to the bit line BL6 via the conductive layer 40, the conductive layer 511, and the conductive plug 521 that function as the contact plug CBL. Similar to the conductive layer 39, which is the fourth layer from the upper layer, the conductive layer 39, which is the fifth layer from the upper layer, is electrically connected to the bit line BL4, the conductive layer 39, which is the sixth layer from the upper layer, is electrically connected to the bit line BL2, and the conductive layer 39, which is the seventh layer from the upper layer, is electrically connected to the bit line BL0. Further, FIG. 6 shows the hole HL1 whose bottom surface reaches the conductive layer 39, which is the fourth layer from the upper layer, the hole HL1 whose bottom surface reaches the conductive layer 39, which is the fifth layer from the upper layer, the hole HL1 whose bottom surface reaches the conductive layer 39, which is the sixth layer from the upper layer, and the hole HL1 whose bottom surface reaches the conductive layer 39, which is the seventh layer from the upper layer.

5. Structure of Memory Cell Region, Selection Gate Region, Source Region, Step Contact Region FIG. 7 is a diagram showing a configuration of the select gate line, the bit line, and the source line provided in the nonvolatile semiconductor storage device 1 shown in FIG. 4 and FIG. 5. The configuration shown in FIG. 7 is an example, and the configuration of the memory cell array 18 of the nonvolatile semiconductor storage device according to the embodiment is not limited to the example shown in FIG. 7. Descriptions of configurations that are the same as or similar to those in FIGS. 1 to 6 may be omitted.

As shown in FIG. 7, the first memory configuration MR (1st MR) and the second memory configuration MR (2nd MR) include the source region CELEA on the even-numbered bit line BL (even) side, the selection gate region SGEA on the even-numbered bit line BL (even) side, the memory cell region MTA of memory cell array 18, the selection gate region SG0A on the odd-numbered bit line BL (odd) side, and the source region CELOA on the odd-numbered bit line BL (odd) side.

The first memory configuration MR (1stMR) and the second memory configuration MR (2ndMR) are provided symmetrically with respect to, for example, the step contact region SCDOA corresponding to the odd-numbered bit line BL (odd). Further, the first memory configuration MR (1stMR) and the second memory configuration MR (2ndMR) are provided symmetrically with respect to, for example, the step contact region SCDEA corresponding to the even-numbered bit line BL (even). In the memory cell array 18 according to the embodiment, a configuration, in which the first memory configuration MR (1stMR) and the second memory configuration MR (2ndMR) are symmetric disposed, is repeatedly disposed in the X direction and the Y direction.

In the first memory configuration MR (1stMR), in the source region CELEA, for example, the source line CELSRC is electrically connected to the memory group MGo1 and the memory group MGo5 via the source line pillar SLP. In the selection gate region SGEA and the selection gate region SG0A, the select gate line SG (not shown) is electrically connected to the gate electrode of each select transistor ST via the select gate line pillar SGP. In the memory cell region MTA, for example, the word line WLIo0e3 is electrically connected to the gate electrode of the memory cell transistor MT0Io and the gate electrode of the memory cell transistor MT3Ie via the word line pillar WLP, and the word line WLOo3e0 is electrically connected to the gate electrode of the memory cell transistor MT0Oe and the gate electrode of the memory cell transistor MT3Oo via the word line pillar WLP.

For example, in the step contact region SCDEA corresponding to the even-numbered bit line BL (even), the bit line BLPE formed with the conductive layer 39 is electrically connected to all memory groups MGe (including memory group MGe0 and memory group MGe4) provided on the conductive layer 39 (for example, the fourth conductive layer 39 from the top shown in FIG. 6) via the contact plug CBL4. Further, the bit line BLPE formed with the other conductive layer 39 is electrically connected to all the memory groups MGe provided in the other conductive layer 39 (for example, the sixth conductive layer 39 from the top shown in FIG. 6) via the contact plug CBL0.

For example, in the step contact region SCDOA corresponding to the odd-numbered bit line BL (odd), the bit line BLPO formed with the still another conductive layer 39 (for example, the third conductive layer 39 from the top shown in FIG. 6) is electrically connected to all memory groups MGo (including the memory group MGo1 and the memory group MGo5) provided in the still another conductive layer 39 via the contact plug CBL1. Further, the bit line BLPO formed with further different conductive layer 39 is electrically connected to all the memory groups MGo provided in the further different conductive layer 39 (for example, the fifth conductive layer 39 from the top shown in FIG. 6) via the contact plug CBL5.

6. Overview of Write Operation

The operation method of the memory cell array 18 shown in FIGS. 2 and 3 will be described. Assuming that the number of layers of the semiconductor layer 31 is k, the regions separated by the memory trench MTR (each of the memory regions MR) include k memory groups MG stacked in the Z direction.

The case where the number of layers of the semiconductor layer 31 is k=12 will be described as an example. In this case, the memory groups MG with 12 layers (memory string pairs) are stacked. Further, among the memory groups MG with 12 layers (memory string pairs), the memory string MS of each layer arranged at the same location with respect to the Y direction is electrically connected to the same select gate line SG. For example, among the memory groups MG with 12 layers (memory string pairs), the memory strings MSIe and MSIo of each layer arranged at the same location with respect to the Y direction is electrically connected to the same select gate line SG. In other words, among the memory groups MG with 12 layers (memory string pairs), the memory strings MSIe and MSIo of each layer arranged at the same location with respect to the Y direction belong to the same string unit SU.

For example, the nonvolatile semiconductor storage device 1 according to the embodiment repeatedly executes a software program loop in the write operation. The software program loop includes an EVEN program operation, an ODD program operation, and a verification operation. The EVEN program operation and the ODD program operation are operations to raise the threshold voltage of the selected memory cell transistor MT by injecting electrons into the charge storage layer in the selected memory cell transistor MT. Alternatively, the EVEN program operation and the ODD program operation are operations for maintaining the threshold voltage of the selected memory cell transistor MT by prohibiting the injection of electrons into the charge storage layer. The verification operation is an operation of checking whether or not the threshold voltage of the selected memory cell transistor MT reaches the target level by the operation of performing read using the verification voltage following the EVEN program operation and the ODD program operation. The selected memory cell transistor MT whose threshold voltage reaches the target level is then write-inhibited.

In the nonvolatile semiconductor storage device 1 according to the embodiment, by repeatedly executing the software program loop including the EVEN program operation, the ODD program operation, and the verification operation described above, the threshold voltage of the selected memory cell transistor MT is raised to a target level.

The electrons stored in the charge storage layer may be stored in an unstable state. Therefore, from the time when the above-mentioned program operation is ended, the electrons stored in the charge storage layer of the memory cell transistor MT may escape from the charge storage layer with the passage of time. When the electrons escape from the charge storage layer, the threshold voltage of the memory cell transistor MT drops. Therefore, in the read operation executed after the write operation is completed, in order to cope with such a decrease in the threshold voltage of the memory cell transistor that may occur with the passage of time, the read operation is performed by using a read voltage that is lower than the verification voltage. It is noted that such a read operation is included in the verification operation. Further, in the embodiment, each of the operations of the nonvolatile semiconductor storage device 1 is provided in each of the operation methods. More specifically, the write operation of the nonvolatile semiconductor storage device 1 is provided in the write operation method, the read operation of the nonvolatile semiconductor storage device 1 is provided in the read operation method, the erasing operation of the nonvolatile semiconductor storage device 1 is provided in the erasing operation method, and the verification operation of the nonvolatile semiconductor storage device 1 is provided in the verification operation method.

6-1. One Example of Write Operation

Figure 8:
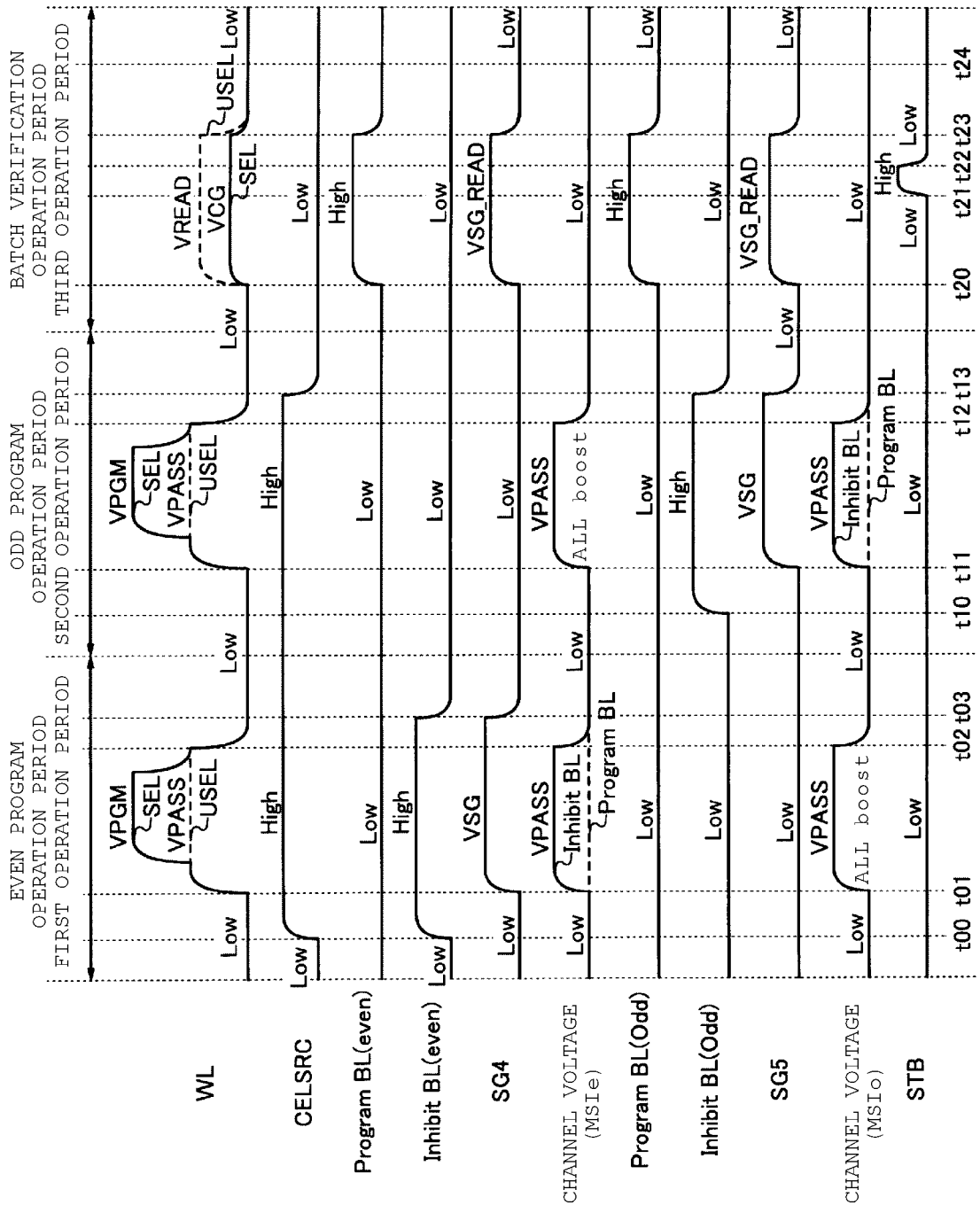
FIG. 8 is a diagram showing a timing chart of a write operation in the semiconductor storage device according to the embodiment.

FIG. 8 is a diagram showing a timing chart of the write operation in the memory cell array 18 in the nonvolatile semiconductor storage device 1 according to the embodiment. The timing chart shown in FIG. 8 is a timing chart showing an example of the time change of the voltage applied to various circuit elements. FIG. 8 is only a schematic timing chart for showing the voltage applied to the various circuit elements. The timing chart shown in FIG. 8 does not necessarily accurately show, for example, changes in the voltage supplied to the word line and the voltage of the select gate line SG. The timing chart shown in FIG. 8 is an example, and the timing chart of the nonvolatile semiconductor storage device according to the embodiment is not limited to the example shown in FIG. 8. Descriptions of configurations that are the same as or similar to those in FIGS. 1 to 7 may be omitted.

In the following description, among the memory strings of each of the semiconductor layers 31, the memory string MSIe and the memory string MSIo will be focused on. The semiconductor layer 31 is referred to as a channel layer (channel), and the voltage of the channel layer is referred to as a channel voltage. In each memory string MS, the word line WL, which is connected to the memory cell transistor MT to be selected, is referred to as a selected word line SEL-WL, and the rest of word lines that are connected to the memory cell transistor MT are referred to as non-selected word lines USEL-WL. In FIG. 8, the selected word line SEL-WL is represented by SEL in WL, and the non-selected word line USEL-WL is represented by USEL in WL. The selected word line SEL-WL and the non-selected word line USEL-WL are defined to be common to all semiconductor layers (common to all layers). In the embodiment, among the memory strings of each of the semiconductor layers 31, the bit line BL that is electrically connected to the memory string including the memory cell transistor MT, which is a target of the operation, (memory cell transistor MT to which data (which is represented by the threshold voltage) is written) is referred to as a bit line ProgramBL. The bit line BL that is electrically connected to the memory string including the memory cell transistor MT other than the memory cell transistor MT, which is a target of the operation, (memory cell transistor MT to which data (which is represented by the threshold voltage) is not written) is referred to as a bit line InhibitBL.

As shown in FIG. 8, in the write operation according to the embodiment, first, the sequencer 15 executes the EVEN program operation with respect to the memory cell transistor MT in the memory string MSIe. That is, in the EVEN program operation, the threshold voltage of the memory cell transistor MT in the memory string MS that is electrically connected to the even-numbered bit line BL (even) is raised.

As shown in FIG. 8, in the EVEN program operation, the sequencer 15 transmits a signal (for example, a signal transmitted to the even-numbered select gate line SG4) for turning on (ON) or off (OFF) the select transistors ST1Ie and ST2Ie in the memory string MSIe, and select transistors ST4Io and ST3Io in the memory string MSIo depending on a relationship with the voltage of the bit line BL. For example, the signal transmitted to the even-numbered select gate line SG4 includes a voltage VSG. That is, in the EVEN program operation, the sequencer 15 supplies a voltage VSG to the even-numbered select gate line SG (even) that is connected to each of the gates of the select transistors ST1Ie and ST2Ie in the memory string MSIe, and select transistors ST4Io and ST3Io in the memory string MSIo. At this time, the sequencer 15 transmits a signal (for example, a signal transmitted to the odd-numbered select gate line SG5) for turning off (OFF) the select transistors ST3Ie and ST4Ie in the memory string MSIe, and select transistors ST1Io and ST2Io in the memory string MSIo regardless of the voltage of the bit line BL. Further, different voltages (voltage VPGM, voltage VPASS) are supplied to the selected word line SEL-WL and the non-selected word line USEL-WL.

Further, the sequencer 15 supplies a low (Low, L) level voltage to the bit line ProgramBL (even), the bit line ProgramBL (odd), the bit line InhibitBL (odd), and the control signal STB, and supplies a high (High, H) level voltage to the source line CELSRC and the bit line InhibitBL (even). As a result, in the memory string MSIe connected to the ProgramBL (even), the select transistors ST3 and ST4 on the BL side are turned on, and a low level of the bit line ProgramBL (even) is applied to the channel of the memory string MSIe.

On the other hand, in the memory string MSIe connected to the bit line InhibitBL (even), the select transistors ST1 and ST2 on the BL side are turned off, and the channel of the memory string MSIe enters a floating state. As a result, the channel of the memory string MSIe is boosted.

As a result, the nonvolatile semiconductor storage device 1 according to the embodiment is electrically connected to the even-numbered bit line BL (even) in the EVEN program operation and can raise the threshold voltage of the memory cell transistor MT selected by the selected word line SEL-WL.

As shown in FIG. 8, in the ODD program operation following the EVEN program operation, the sequencer 15 executes the ODD program operation with respect to the memory cell transistor MT in the memory string MSIo. The sequencer 15 transmits a signal (for example, a signal transmitted to the odd-numbered select gate line SG5) for turning on (ON) or off (OFF) the select transistors ST1Io and ST2Io in the memory string MSIo, and the select transistors ST4Ie and ST3Ie in the memory string MSIe depending on the relationship with the voltage of the bit line BL. That is, in the ODD program operation, the sequencer 15 supplies a voltage VSG to the odd-numbered select gate line SG (odd) that is connected to each of the gates of the select transistors ST1Ie and ST2Ie in the memory string MSIo, and select transistors ST4Io and ST3Io in the memory string MSIe. At this time, the sequencer 15 transmits a signal (for example, a signal transmitted to the even-numbered select gate line SG4) for turning off (OFF) the select transistors ST3Io and ST4Io in the memory string MSIo, and select transistors ST1Ie and ST2Ie in the memory string MSIe regardless of the voltage of the bit line BL. Further, different voltages (voltage VPGM, voltage VPASS) are supplied to the selected word line SEL-WL and the non-selected word line USEL-WL.

Further, the sequencer 15 supplies a low (Low, L) level voltage to the bit line ProgramBL (odd), the bit line ProgramBL (even), the bit line InhibitBL (even), and the control signal STB, and supplies a high (High, H) level voltage to the source line CELSRC and the bit line InhibitBL (odd). As a result, in the memory string MSIo connected to the ProgramBL (odd), the select transistors ST1 and ST2 on the BL side are turned on, and a low level of the bit line ProgramBL (odd) is applied to the channel of the memory string MSIo.

On the other hand, in the memory string MSIo connected to the bit line InhibitBL (odd), the select transistors ST1 and ST2 on the BL side are turned off, and the channel of the memory string MSIo enters a floating state. As a result, the channel of the memory string MSIo is boosted.

As a result, the nonvolatile semiconductor storage device 1 according to the embodiment is electrically connected to the odd-numbered bit line BL (odd) in the ODD program operation and can raise the threshold voltage of the memory cell transistor MT selected by the selected word line SEL-WL.

Subsequently, as shown in FIG. 8, in the write operation according to the embodiment, the sequencer 15 executes a batch verification operation for all the memory cell transistor MT in order to verify the result of the program operation. In the batch verification operation in the nonvolatile semiconductor storage device 1 according to the embodiment, the sequencer 15 transmits a signal for turning on (ON) the select transistors ST1Io, ST2Io, ST3Io, and ST4Io in the memory string MSIo, and the select transistors ST1Ie, ST2Ie, ST3Ie, and ST4Ie in the memory string MSIe. The signal for turning on the transistors includes, for example, a voltage VSG_READ.

Further, the sequencer 15 supplies different voltages (voltage VCG, voltage VREAD) to the selected word line SEL-WL and the non-selected word line USEL-WL. Further, the sequencer 15 supplies a high (High, H) level voltage to the bit line ProgramBL (even) and the bit line ProgramBL (odd), and supplies a low (Low, L) level voltage to the source line CELSRC, the bit line InhibitBL (even), and the bit line InhibitBL (odd).

Further, the sequencer 15 supplies a low (Low, L) level voltage to the channels of the memory cell transistor MT in the memory string MSIe and the memory cell transistor MT in the memory string MSIo, and sets the channel voltage of the memory cell transistor MT in the memory string MSIe and the channel voltage of the memory cell transistor MT in the memory string MSIo to the low (Low, L) level. Further, the sequencer 15 supplies the control signal STB that transitions between the low level and the high level. When the control signal STB goes from low level to high level, the control signal STB is asserted.

In the batch verification operation, the nonvolatile semiconductor storage device 1 according to the embodiment can verify the result of the program operation with respect to the memory cell transistor MT.

In the nonvolatile semiconductor storage device 1 according to the embodiment, a period for executing the EVEN program operation may be referred to as a "first operation period", a period for executing the ODD program operation may be referred to as a "second operation period", and a period for executing the batch verification operation may be referred to as a "third operation period".

Further, in the nonvolatile semiconductor storage device 1 according to the embodiment, the high level voltage is, for example, 2.2 V. The low level voltage is, for example, 0 V. The voltage VSG is, for example, 3 V. The voltage VPGM is, for example, 24 V. The voltage VPASS is, for example, 9 V. The voltage VSG_READ is, for example, 5V. The voltage supplied to the bit line ProgramBL is higher than the low level voltage. The voltage VREAD is, for example, 5 V, and is higher than the voltage VCG. It is noted that the voltage VCG may be a negative voltage.

The program operation of a comparative example (a three-dimensional NAND flash memory in which an existing memory string extends in the horizontal direction) will be described. For example, in the nonvolatile semiconductor storage device 1 according to the embodiment shown in FIGS. 2 and 3, the bit line BL (even) electrically connected to the memory group MGe is provided on a side opposite to the bit line BL (odd) that is electrically connected to the memory group MGo with respect to the X direction. On the other hand, in the three-dimensional NAND flash memory of the comparative example, the bit line BL (even) electrically connected to the memory group MGe is provided on the same side as the bit line BL (odd) that is electrically connected to the memory group MGo with respect to the X direction, and the memory group MGe and the memory group MGo are connected to a common bit line BL.

In the three-dimensional NAND flash memory of the comparative example, for example, when executing a program operation on the memory cell transistor MT in the memory group MGe, the select transistor ST1 of the memory string MSIe and the select transistor ST2 of the memory string MSOe, or the select transistor ST2 of the memory string MSIe and the select transistor ST1 of the memory string MSOe are turned on. As a result, the memory group MGo adjacent to the memory group MGe enters a slightly selected state (semi-selected state). The memory group MGo adjacent to the memory group MGe is a memory string in which a program operation is not executed. Since the memory group MGo adjacent to the memory group MGe is connected to the common bit line BL, the memory group MGo adjacent to the memory group MGe in the semi-selected state is supplied with a current based on the voltage supplied to the bit line BL. The memory group MGo adjacent to the memory group MGe in the semi-selected state cannot sufficiently cut off the current. In other words, the memory group MGo adjacent to the memory group MGe in the semi-selected state is not electrically disconnected from the bit line BL. As a result, in the program operation of the memory cell transistor MT in the memory group MGe, even when the channel of the memory group MGo adjacent to the memory group MGe is supplied with a voltage, the channel of the memory group MGo adjacent to the memory group MGe is not sufficiently boosted, thereby there is a possibility that an erroneous write to the memory cell transistor MT in the memory group MGo adjacent to the memory group MGe in which a program operation is not executed occurs.

On the other hand, in the nonvolatile semiconductor storage device 1 according to the embodiment, when executing the program operation to the memory cell transistor MT in the memory string MSIe, the select transistors ST1 and ST2 of the memory string MSIe are turned on. Therefore, the select transistors ST3 and ST4 of the memory string MSIo adjacent to the memory string MSIe that share the select gate line SG with the select transistors ST1 and ST2 of the memory string MSIe are also turned on. As a result, the memory string MSIo adjacent to the memory string MSIe is also selected. As described above, in the nonvolatile semiconductor storage device 1 according to the embodiment, the memory string MSIe and the memory string MSIo are connected to the bit lines BL (BL (even), BL (odd)) different from each other. Even when the memory string MSIo is selected while the memory string MSIe is selected, a low level voltage can be supplied to the bit line BL (odd). As a result, the current, which is based on the voltage supplied to the bit line BL, does not flow through the memory string MSIo in which a program operation is not executed. Therefore, when the channel of the memory string MSIo is supplied with a voltage, the channel of the memory string MSIo is sufficiently boosted. In the nonvolatile semiconductor storage device 1 according to the embodiment, there is no possibility that the memory string enters a semi-selected state. As a result, in the nonvolatile semiconductor storage device 1 according to the embodiment, the erroneous write to the memory cell transistor MT in the memory string MSIo in which a program operation is not executed is prevented.

6-2. Example of First Operation Period

The description will be continued by returning to FIG. 8. The sequencer 15 (FIG. 1) performs control to apply or supply a voltage at various times to the selected word line SEL-WL, the non-selected word line USEL-WL, source line CELSRC, the bit line ProgramBL (even), the bit line InhibitBL (even), the select gate line SG4, the channel of the memory string MSIe, the bit line ProgramBL (odd), the bit line InhibitBL (odd), the select gate line SG5, the channel of the memory string MSIo, and the control signal STB.

Specifically, the sequencer 15 controls the voltage generation circuit 17 (FIG. 1), the column decoder 22 (FIG. 1), the row decoder 19 (FIG. 1), and the sense amplifier module 20 (FIG. 1), and the voltage generation circuit 17, the column decoder 22, the row decoder 19, or the sense amplifier module 20 to apply or supply at various times a voltage to the selected word line SEL-WL, the non-selected word line USEL-WL, source line CELSRC, the bit line ProgramBL (even), the bit line InhibitBL (even), the select gate line SG4, the channel of the memory string MSIe, the bit line ProgramBL (odd), the bit line InhibitBL (odd), the select gate line SG5, the channel of the memory string MSIo, and the control signal STB.

The EVEN program operation is executed by using the sequencer 15. The period during which the EVEN program operation is executed is the first operation period.

When the first operation period starts, the sequencer 15 supplies a low (Low, L) level voltage to the selected word line SEL-WL, the non-selected word line USEL-WL, source line CELSRC, the bit line ProgramBL (even), the bit line InhibitBL (even), the select gate line SG4, the channel of the memory string MSIe, the bit line ProgramBL (odd), the bit line InhibitBL (odd), the select gate line SG5, the channel of the memory string MSIo, and the control signal STB. The low level voltage is, for example, a voltage VSS.

The voltage and the like applied to each signal line from time t00 to time t01 in the first operation period will be described. The selected word line SEL-WL, the non-selected word line USEL-WL, the bit line ProgramBL (even), the select gate line SG4, the channel of the memory cell transistor MT of the memory string MSIe, the bit line ProgramBL (odd), the bit line InhibitBL (odd), the select gate line SG5, the channel of the memory cell transistor MT of the memory string MSIo, and the control signal STB are supplied with a low (Low, L) level voltage. The source line CELSRC and the bit line InhibitBL (even) are supplied with a high (High, H) level voltage from a low level voltage.

The voltage and the like applied to each signal line from the time t01 to the time t02 of the first operation period will be described. The selected word line SEL-WL is supplied with a voltage VPASS from a low level voltage and then is supplied with the voltage VPGM. Further, the selected word line SEL-WL is supplied with the voltage VPGM and then is supplied with the voltage VPASS. The non-selected word line USEL-WL is supplied with a voltage VPASS from a low level voltage. The source line CELSRC and the bit line InhibitBL (even) are supplied with a high level voltage. The bit line ProgramBL (even), the bit line ProgramBL (odd), the bit line InhibitBL (odd), the select gate line SG5, and the control signal STB are supplied with a low level voltage. The select gate line SG4 is supplied with a voltage VSG from a low level voltage. At this time, the select transistors ST1Ie and ST2Ie that are provided in the memory string MSIe, and the select transistors ST4Io and ST3Io that are provided in the memory string MSIo enter an ON state or an OFF state depending on the relationship with the voltage of the bit line BL, and the select transistors ST3Ie and ST4Ie that are provided in the memory string MSIe, and the select transistors ST1Io and ST2Io that are provided in the memory string MSIo enter an OFF state. The channel of the memory cell transistor MT of the memory string MSIe connected to the bit line ProgramBL (even) is supplied with a low level voltage, and so the channel voltage of the memory cell transistor MT of the memory string MSIe connected to the bit line ProgramBL (even) is set to a low level. The channel voltage of the memory cell transistor MT of the memory string MSIe connected to the bit line InhibitBL (even) and the channel voltage of the memory cell transistor MT of the memory string MSIo are raised to the voltage VPASS, and so the channel of the memory cell transistor MT of the memory string MSIe connected to the bit line InhibitBL (even) and the channel of the memory cell transistor MT of the memory string MSIo are boosted. In the memory string MSIe connected to the bit line ProgramBL (even), since the voltage VPGM is supplied to the gate electrode of the memory cell transistor MT to which the selected word line SEL-WL is connected, a voltage VPGM is applied between the memory cell transistor MT and the low level channel, and so the threshold voltage of the memory cell transistor MT of the memory string MSIe connected to the bit line ProgramBL (even) is raised.

The voltage and the like applied to each signal line from the time t02 to the time t03 of the first operation period will be described. The selected word line SEL-WL is supplied with a low level voltage from the voltage VPASS. The non-selected word line USEL-WL is supplied with a low level voltage from the voltage VPASS. The source line CELSRC and the bit line InhibitBL (even) are supplied with a high level voltage. The bit line ProgramBL (even), the bit line ProgramBL (odd), the bit line InhibitBL (odd), the select gate line SG5, and the control signal STB are supplied with a low level voltage. The select gate line SG4 is supplied with a voltage VSG. At this time, the select transistors ST1Ie and ST2Ie that are provided in the memory string MSIe, and the select transistors ST4Io and ST3Io that are provided in the memory string MSIo are in an ON state or an OFF state depending on the relationship with the voltage of the bit line BL, and the select transistors ST3Ie and ST4Ie that are provided in the memory string MSIe, and the select transistors ST1Io and ST2Io that are provided in the memory string MSIo are in an OFF state. The channel voltage of the memory cell transistor MT of the memory string MSIe connected to the bit line ProgramBL (even) is a low level. The channel voltage of the memory cell transistor MT of the memory string MSIe connected to the bit line InhibitBL (even) and the channel voltage of the memory cell transistor MT of the memory string MSIo drops to a low level voltage at the same time as the voltage of the word line WL drops from the voltage VPASS to the low level voltage. The gate electrode of the memory cell transistor MT of the memory string MSIe connected to the bit line ProgramBL (even) is supplied with a low level voltage, and the memory cell transistor MT of the memory string MSIe connected to the bit line ProgramBL (even) is in an OFF state. Therefore, the memory cell transistor MT of the memory string MSIe connected to the bit line ProgramBL (even) retains the raised threshold voltage.

The voltage and the like applied to each signal line after the time t03 of the first operation period will be described. The selected word line SEL-WL, the non-selected word line USEL-WL, the bit line ProgramBL (even), the channel of the memory cell transistor MT of the memory string MSIe, the bit line ProgramBL (odd), the bit line InhibitBL (odd), the select gate line SG5, the channel of the memory cell transistor MT of the memory string MSIo, and the control signal STB are supplied with a low (Low, L) level voltage. The bit line InhibitBL (even) is supplied with a low level voltage from a high level voltage. The select gate line SG4 is supplied with a low level voltage from the voltage VSG. At this time, the select transistors ST1Ie and ST2Ie that are provided in the memory string MSIe, the select transistors ST4Io and ST3Io that are provided in the memory string MSIo, the select transistors ST3Ie and ST4Ie that are provided in the memory string MSIe, and the select transistors ST1Io and ST2Io that are provided in the memory string MSIo are in an OFF state.

As described above, the first operation period is ended. In the first operation period (period of the EVEN program operation), the nonvolatile semiconductor storage device 1 according to the embodiment is electrically connected to the even-numbered bit line BL (even) and raises the threshold voltage of the memory cell transistor MT selected by the selected word line SEL-WL, and then the memory cell transistor MT selected by the selected word line SEL-WL can store the raised threshold voltage.

6-3. Example of Second Operation Period

In the second operation period, similar to the first operation period, the sequencer 15 (FIG. 1) controls the voltage generation circuit 17 (FIG. 1), the column decoder 22 (FIG. 1), the row decoder 19 (FIG. 1), and the sense amplifier module 20 (FIG. 1), and the voltage generation circuit 17, the column decoder 22, the row decoder 19, or the sense amplifier module 20 to apply or supply at various times a voltage to the selected word line SEL-WL, the non-selected word line USEL-WL, source line CELSRC, the bit line ProgramBL (even), the bit line InhibitBL (even), the select gate line SG4, the channel of the memory string MSIe, the bit line ProgramBL (odd), the bit line InhibitBL (odd), the select gate line SG5, the channel of the memory string MSIo, and the control signal STB.

Following the EVEN program operation, the ODD program operation is executed by using the sequencer 15. The period during which the ODD program operation is executed is the second operation period.

When the second operation period starts following the first operation period, similar to the first operation period, the sequencer 15 supplies a low (Low, L) level voltage to the selected word line SEL-WL, the non-selected word line USEL-WL, the bit line ProgramBL (even), the bit line InhibitBL (even), the select gate line SG4, the channel of the memory string MSIe, the bit line ProgramBL (odd), the bit line InhibitBL (odd), the select gate line SG5, the channel of the memory string MSIo, and the control signal STB. The source line CELSRC is kept at a high level voltage.

The voltage and the like applied to each signal line from the time t10 to the time t11 of the second operation period will be described. The selected word line SEL-WL, the non-selected word line USEL-WL, the bit line ProgramBL (even), the bit line InhibitBL (even), the select gate line SG4, the channel of the memory cell transistor MT of the memory string MSIe, the bit line ProgramBL (odd), the select gate line SG5, the channel of the memory cell transistor MT of the memory string MSIo, and the control signal STB are supplied with a low level voltage. The bit line InhibitBL (odd) is supplied with a high (High, H) level voltage from a low level voltage.

The voltage and the like applied to each signal line from the time t11 to the time t12 of the second operation period will be described. The selected word line SEL-WL is supplied with a voltage VPASS from a low level voltage and then is supplied with the voltage VPGM. Further, the selected word line SEL-WL is supplied with the voltage VPGM and then is supplied with the voltage VPASS. The non-selected word line USEL-WL is supplied with a voltage VPASS from a low level voltage. The source line CELSRC and the bit line InhibitBL (odd) are supplied with a high level voltage. The bit line ProgramBL (even), the bit line InhibitBL (even), the select gate line SG4, the bit line ProgramBL (odd), and the control signal STB are supplied with a low level voltage. The select gate line SG5 is supplied with a voltage VSG from a low level voltage. At this time, the select transistors ST1Io and ST2Io that are provided in the memory string MSIo, and the select transistors ST4Ie and ST3Ie that are provided in the memory string MSIe enter an ON state or an OFF state depending on the relationship with the voltage of the bit line BL, and the select transistors ST3Io and ST4Io that are provided in the memory string MSIo, and the select transistors ST1Ie and ST2Ie that are provided in the memory string MSIe enter an OFF state. The channel of the memory cell transistor MT of the memory string MSIo connected to the bit line ProgramBL (odd) is supplied with a low level voltage, and so the channel voltage of the memory cell transistor MT of the memory string MSIo connected to the bit line ProgramBL (odd) is set to a low level. The channel voltage of the memory cell transistor MT of the memory string MSIo connected to the bit line InhibitBL (odd) and the channel voltage of the memory cell transistor MT of the memory string MSIe are raised to the voltage VPASS, and so the channel of the memory cell transistor MT of the memory string MSIo connected to the bit line InhibitBL (odd) and the channel of the memory cell transistor MT of the memory string MSIe are boosted. In the memory string MSIo connected to the bit line ProgramBL (odd), since the voltage VPGM is supplied to the gate electrode of the memory cell transistor MT to which the selected word line SEL-WL is connected, a voltage VPGM is applied between the memory cell transistor MT and the low level channel, and so the threshold voltage of the memory cell transistor MT of the memory string MSIo connected to the bit line ProgramBL (odd) is raised.

The voltage and the like applied to each signal line from the time t12 to the time t13 of the second operation period will be described. The selected word line SEL-WL is supplied with a low level voltage from the voltage VPASS. The non-selected word line USEL-WL is supplied with a low level voltage from the voltage VPASS. The source line CELSRC and the bit line InhibitBL (odd) are supplied with a high level voltage. The bit line ProgramBL (even), the bit line InhibitBL (even), the select gate line SG4, the bit line ProgramBL (odd), and the control signal STB are supplied with a low level voltage. The select gate line SG5 is supplied with a voltage VSG. At this time, the select transistors ST1Io and ST2Io that are provided in the memory string MSIo, and the select transistors ST4Ie and ST3Ie that are provided in the memory string MSIe are in an ON state or an OFF state depending on the relationship with the voltage of the bit line BL, and the select transistors ST3Io and ST4Io that are provided in the memory string MSIo, and the select transistors ST1Ie and ST2Ie that are provided in the memory string MSIe are in an OFF state. The channel voltage of the memory cell transistor MT of the memory string MSIo connected to the bit line ProgramBL (odd) is a low level. The channel voltage of the memory cell transistor MT of the memory string MSIo connected to the bit line InhibitBL (odd) and the channel voltage of the memory cell transistor MT of the memory string MSIe drops to a low level voltage at the same time as the voltage of the word line WL drops from the voltage VPASS to the low level voltage. The gate electrode of the memory cell transistor MT of the memory string MSIo connected to the bit line ProgramBL (odd) is supplied with a low level voltage, and the memory cell transistor MT of the memory string MSIo connected to the bit line ProgramBL (odd) is in an OFF state. Therefore, the memory cell transistor MT of the MSIo connected to the bit line ProgramBL (odd) retains the raised threshold voltage.

The voltage and the like applied to each signal line after the time t13 of the second operation period will be described. The selected word line SEL-WL, the non-selected word line USEL-WL, the bit line ProgramBL (even), the bit line InhibitBL (even), the select gate line SG4, the channel of the memory cell transistor MT of the memory string MSIe, the bit line ProgramBL (odd), the channel of the memory cell transistor MT of the memory string MSIo, and the control signal STB are supplied with a low (Low, L) level voltage. The source line CELSRC and the bit line InhibitBL (odd) are supplied with a low level voltage from a high level voltage. The select gate line SG5 is supplied with a low level voltage from the voltage VSG. At this time, the select transistors ST1Io and ST2Io that are provided in the memory string MSIo, the select transistors ST4Ie and ST3Ie that are provided in the memory string MSIe, the select transistors ST3Io and ST4Io that are provided in the memory string MSIo, and the select transistors ST1Ie and ST2Ie that are provided in the memory string MSIe are in an OFF state.

As described above, the second operation period is ended. In the second operation period (period of the ODD program operation), the nonvolatile semiconductor storage device 1 according to the embodiment is electrically connected to the odd-numbered bit line BL (odd) and raises the threshold voltage of the memory cell transistor MT selected by the selected word line SEL-WL, and then the memory cell transistor MT selected by the selected word line SEL-WL can store the raised threshold voltage.

6-4. Example of Third Operation Period

In the third operation period, similar to the second operation period, the sequencer 15 (FIG. 1) controls the voltage generation circuit 17 (FIG. 1), the column decoder 22 (FIG. 1), the row decoder 19 (FIG. 1), and the sense amplifier module 20 (FIG. 1), and the voltage generation circuit 17, the column decoder 22, the row decoder 19, or the sense amplifier module 20 to apply or supply at various times a voltage to the selected word line SEL-WL, the non-selected word line USEL-WL, source line CELSRC, the bit line ProgramBL (even), the bit line InhibitBL (even), the select gate line SG4, the channel of the memory string MSIe, the bit line ProgramBL (odd), the bit line InhibitBL (odd), the select gate line SG5, the channel of the memory string MSIo, and the control signal STB.

Following the ODD program operation, the batch verification operation is executed by using the sequencer 15. The period during which the batch verification operation is executed is the third operation period.

When the third operation period starts following the second operation period, similar to the second operation period, the sequencer 15 supplies a low (Low, L) level voltage to the selected word line SEL-WL, the non-selected word line USEL-WL, source line CELSRC, the bit line ProgramBL (even), the bit line InhibitBL (even), the select gate line SG4, the channel of the memory string MSIe, the bit line ProgramBL (odd), the bit line InhibitBL (odd), the select gate line SG5, the channel of the memory string MSIo, and the control signal STB.

The voltage and the like applied to each signal line from the time t20 to the time t23 of the third operation period will be described. The selected word line SEL-WL is supplied with a voltage VCG from a low level voltage. The non-selected word line USEL-WL is supplied with a voltage VREAD from a low level voltage. The source line CELSRC, the bit line InhibitBL (even), the channel of the memory cell transistor MT of the memory string MSIe, the bit line InhibitBL (odd), and the channel of the memory cell transistor MT of the memory string MSIo are supplied with a low level voltage. The bit line ProgramBL (even) and the bit line ProgramBL (odd) are supplied with a high (High, H) level voltage from a low level voltage. The select gate line SG4 and the select gate line SG5 are supplied with the voltage VSG_READ from a low level voltage. At this time, the select transistors ST1Ie and ST2Ie that are provided in the memory string MSIe, the select transistors ST3Io and ST4Io that are provided in the memory string MSIo, the select transistors ST1Io and ST2Io that are provided in the memory string MSIo, and the select transistors ST4Ie and ST3Ie that are provided in the memory string MSIe enter an ON state.

From time t20 to time t21 in the third operation period, the control signal STB is supplied with a low level voltage. From time t21 to time t22 in the third operation period, the control signal STB is supplied with a high level voltage from a low level voltage. From time t21 to time t22 in the third operation period, the selected word line SEL-WL is supplied with a voltage VCG, and when the control signal STB changes from a low level voltage to a high level voltage, the control signal STB is asserted. The voltage VCG is any read voltage. As a result, the threshold voltage, which is stored in the memory cell transistor MT of the memory string MS selected by the selected word line SEL-WL, is read based on the read voltage VCG. The threshold voltage read from the memory cell transistor MT of the memory string MS selected by the selected word line SEL-WL is transferred to the latch circuit (latch circuits ADL, BDL, CDL, and XDL) in the sense amplifier module 20. The sense amplifier module 20 determines whether the threshold voltage, which is read based on any read voltage VCG, is "0" or "1". The latch circuits SDL, ADL, BDL, CDL, and XDL temporarily store the read threshold voltage. Subsequently, from time t22 to time t23 in the third operation period, the control signal STB is supplied with a low level voltage from a high level voltage. When the control signal STB changes from a high level voltage to a low level voltage, the control signal STB is deserted.

The voltage and the like applied to each signal line from time t23 to time t24 and after time t24 in the third operation period will be described. The selected word line SEL-WL is supplied with a low level voltage from the voltage VCG. The non-selected word line USEL-WL is supplied with a low level voltage from the voltage VREAD. The source line CELSRC, the bit line InhibitBL (even), the channel of the memory cell transistor MT of the memory string MSIe, the bit line InhibitBL (odd), the channel of the memory cell transistor MT of the memory string MSIo, and the control signal STB are supplied with a low (Low, L) level voltage. The bit line ProgramBL (even) and the bit line ProgramBL (odd) are supplied with a low level voltage from a high level voltage. The select gate line SG4 and the select gate line SG5 are supplied with a low level voltage from the voltage VSG_READ. At this time, the select transistors ST1Io and ST2Io that are provided in the memory string MSIo, the select transistors ST4Ie and ST3Ie that are provided in the memory string MSIe, the select transistors ST3Io and ST4Io that are provided in the memory string MSIo, and the select transistors ST1Ie and ST2Ie that are provided in the memory string MSIe are in an OFF state.

As described above, the third operation period is ended. In the third operation period (verification operation period), the nonvolatile semiconductor storage device 1 according to the embodiment can read the threshold voltage stored in the memory cell transistor MT of the memory string MS selected by the selected word line SEL-WL and verify the result of the program operation.

7. Circuit Configuration of Sense Amplifier Unit

Figure 9:
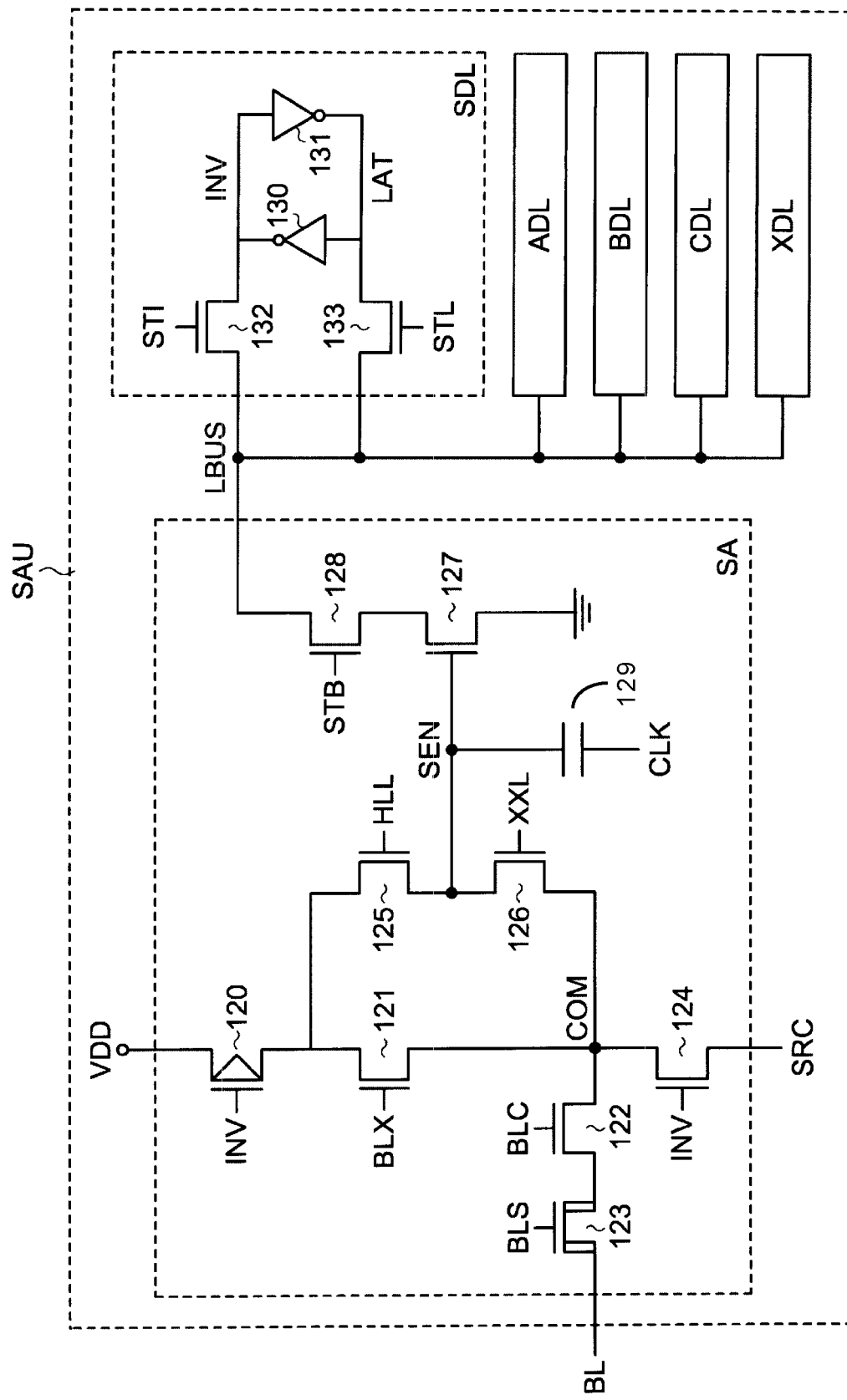
FIG. 9 is a circuit diagram showing an example of a configuration of a circuit of a sense amplifier unit provided in the nonvolatile semiconductor storage device according to the embodiment.

Next, an example of the circuit configuration of the sense amplifier unit SAU will be described. FIG. 9 is an example of the circuit configuration of the sense amplifier unit SAU. It is noted that the circuit configuration of the sense amplifier unit SAU shown in FIG. 9 is an example, and the circuit configuration of the sense amplifier unit SAU of the nonvolatile semiconductor storage device according to the embodiment is not limited to the example shown in FIG. 9. Description of the same or similar configuration as in FIGS. 1 to 8 may be omitted.

The sense amplifier module 20 includes a plurality of sense amplifier units SAU, which are respectively associated with bit lines BL1 to BLm (m is a natural number of 2 or more). FIG. 9 shows the circuit configuration of one sense amplifier unit SAU extracted.

The sense amplifier unit SAU can temporarily store data corresponding to the threshold voltage read by the corresponding bit line BL, for example. Further, the sense amplifier unit SAU can perform a logical count by using the temporarily stored data. Although the details will be described later, the nonvolatile semiconductor storage device 1 can execute the read operation according to the embodiment by using the sense amplifier module 20.

As shown in FIG. 9, the sense amplifier unit SAU includes a sense amplifier section SA and latch circuits SDL, ADL, BDL, CDL, and XDL. The sense amplifier section SA and the latch circuits SDL, ADL, BDL, CDL, and XDL are connected by a bus LBUS so that data can be transmitted and received to each other.

For example, in the read operation, the sense amplifier section SA senses the data (which is represented by the threshold voltage) read by the corresponding bit line BL and determines whether the data corresponding to the read threshold voltage is "0" or "1". The sense amplifier section SA includes, for example, a p-channel MOS transistor 120, n-channel MOS transistors 121 to 128, and a capacitor 129.

One end of the transistor 120 is connected to a power line, and the gate of the transistor 120 is connected to a node INV in the latch circuit SDL. One end of the transistor 121 is connected to the other end of the transistor 120, the other end of the transistor 121 is connected to a node COM, and a control signal BLX is input to a gate of the transistor 121. One end of the transistor 122 is connected to the node COM, and a control signal BLC is input to a gate of the transistor 122. The transistor 123 is a high breakdown voltage MOS transistor, one end of the transistor 123 is connected to the other end of the transistor 122, the other end of the transistor 123 is connected to the corresponding bit line BL, and a control signal BLS is input to a gate of the transistor 123.

One end of the transistor 124 is connected to the node COM, the other end of the transistor 124 is connected to a node SRC, and a gate of the transistor 124 is connected to the node INV. One end of the transistor 125 is connected to the other end of the transistor 120, the other end of the transistor 125 is connected to a node SEN, and a control signal HLL is input to a gate of the transistor 125. One end of the transistor 126 is connected to the node SEN, the other end of the transistor 126 is connected to the node COM, and a control signal XXL is input to a gate of the transistor 126.

One end of transistor 127 is grounded and the gate of transistor 127 is connected to node SEN. One end of the transistor 128 is connected to the other end of the transistor 127, the other end of the transistor 128 is connected to the bus LBUS, and the control signal STB is input to a gate of the transistor 128. One end of the capacitor 129 is connected to the node SEN, and a clock CLK is input to the other end of the capacitor 129.

The control signals BLX, BLC, BLS, HLL, XXL, and STB described above are generated by, for example, the sequencer 15. Further, for example, a voltage VDD, which is an internal power voltage of the nonvolatile semiconductor storage device 1, is applied to the power line that is connected to one end of the transistor 120, and a voltage VSS, which is a ground voltage of the nonvolatile semiconductor storage device 1, is applied to the node SRC, for example.

The latch circuits SDL, ADL, BDL, CDL, and XDL temporarily store the read data. The latch circuit XDL is connected to, for example, a data register 21 and is used for input/output of data between the sense amplifier unit SAU and an input/output circuit 10.

The latch circuit SDL includes, for example, inverters 130 and 131, and n-channel MOS transistors 132 and 133. An input node of the inverter 130 is connected to a node LAT, and an output node of the inverter 130 is connected to the node INV. An input node of the inverter 131 is connected to the node INV, and an output node of the inverter 131 is connected to the node LAT. One end of the transistor 132 is connected to the node INV, the other end of the transistor 132 is connected to the bus LBUS, and a control signal STI is input to a gate of the transistor 132. One end of the transistor 133 is connected to the node LAT, the other end of the transistor 133 is connected to the bus LBUS, and a control signal STL is input to a gate of the transistor 133. For example, the data which is stored in the node LAT corresponds to the data stored in the latch circuit SDL, and the data which is stored in the node INV corresponds to the inverted data of the data stored in the node LAT. Since the circuit configurations of the latch circuits ADL, BDL, CDL, and XDL are the same as those of the latch circuit SDL, for example, the description thereof will be omitted.

In the sense amplifier module 20 described above, the timing at which each sense amplifier unit SAU determines the data corresponding to the threshold voltage read by the bit line BL is based on the timing at which the control signal STB is asserted. In the embodiment, the meaning that "the control signal STB is asserted by the sequencer 15" corresponds to the meaning that the control signal STB is changed from the "L" level to the "H" level by the sequencer 15.

It is noted that the configuration of the sense amplifier module 20 according to the embodiment is not limited to this. For example, in the sense amplifier unit SAU, the transistor 128 to which the control signal STB is input to the gate may be configured with a p-channel MOS transistor. In this case, the meaning that "the control signal STB is asserted by the sequencer 15" corresponds to the meaning that the control signal STB is changed from the "H" level to the "L" level by the sequencer 15.

Further, the number of latch circuits in the sense amplifier unit SAU may be designed to any number. In this case, the number of latch circuits is designed based on, for example, the number of data bits stored by one memory cell transistor MT. Further, a plurality of bit lines BL may be connected to one sense amplifier unit SAU via a selector.

8. Threshold Voltage Distribution of Memory Cell Transistor

Figure 10:
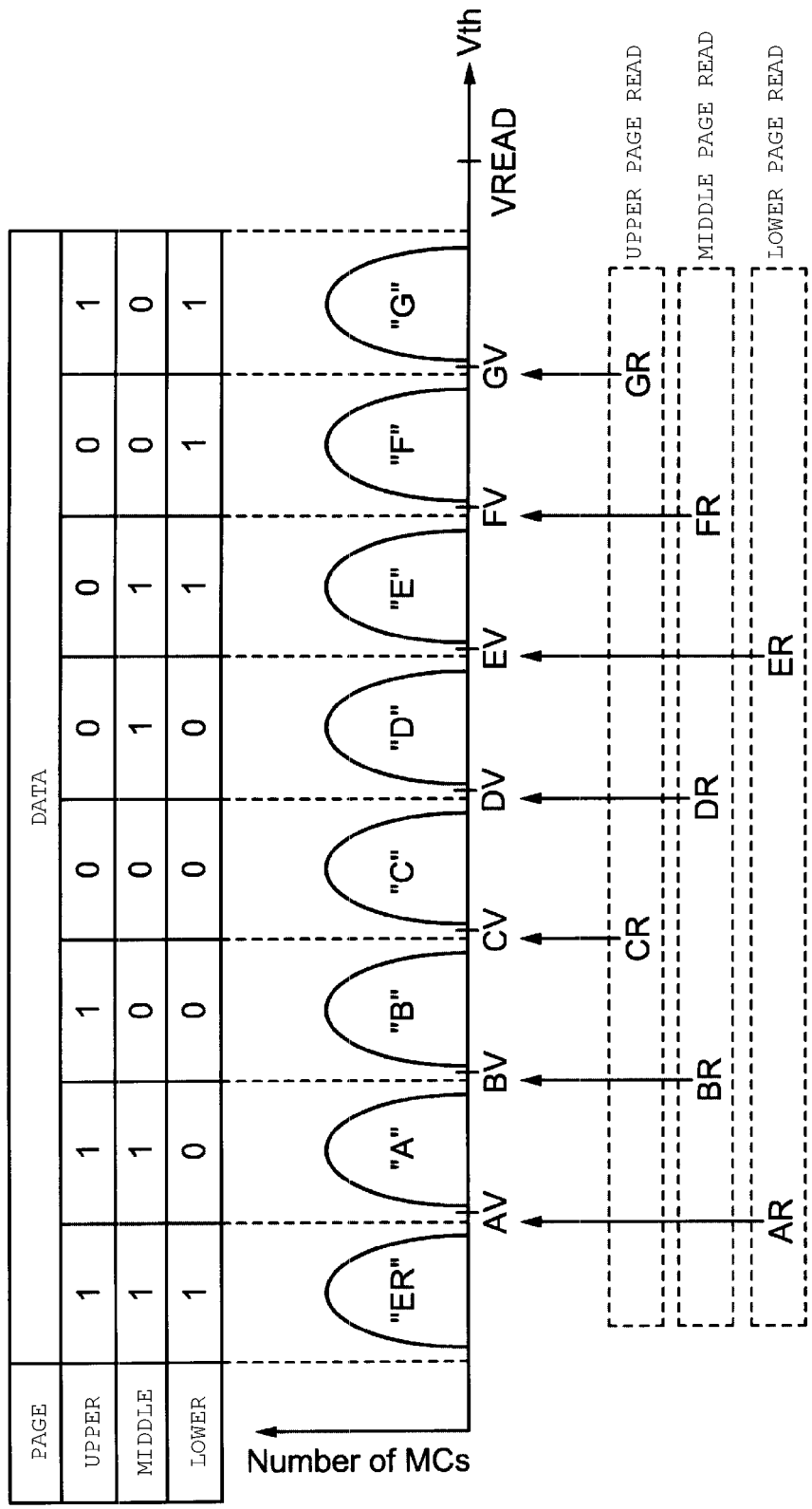
FIG. 10 is a diagram showing an example of a threshold voltage distribution of a memory cell transistor according to the embodiment.

Next, an example of the threshold voltage distribution of the memory cell transistor MT will be described. FIG. 10 is a diagram of a threshold voltage distribution showing an example of the threshold voltage distribution of the memory cell transistor MT. It is noted that the threshold voltage distributions of the memory cell transistor MT shown in FIG. 10 is an example, and the threshold voltage distributions of the memory cell transistor MT of the nonvolatile semiconductor storage device according to the embodiment is not limited to the example shown in FIG. 10. Descriptions of configurations that are the same as or similar to those in FIGS. 1 to 9 may be omitted.

The nonvolatile semiconductor storage device 1 according to the embodiment, as a write method for the memory cell transistor MT, a triple-level cell (TLC) method for storing 3-bit data in one memory cell transistor MT is used for example.

FIG. 10 shows an example of the threshold voltage distribution of the memory cell transistor MT, the assignment of 3-bit data, the read voltage, and the verification voltage in the TLC method. The vertical axis of the threshold voltage distribution shown in FIG. 3 corresponds to the number of memory cell transistors MT, and the horizontal axis corresponds to the threshold voltage Vth of the memory cell transistor MT.

In the TLC system, the plurality of memory cell transistors MT form eight threshold voltage distributions as shown in FIG. 3. These eight threshold voltage distributions respectively correspond to write states, which are referred to as "ER" state, "A" state, "B" state, "C" state, "D" state, "E" state, "F" state, and "G" state in order of increasing the threshold voltage. Different 3-bit data are assigned to the "ER" state, "A" state, "B" state, "C" state, "D" state, "E" state, "F" state, and "G" state, for example, as shown below.

"ER" state: "111" ("lower bit/middle bit/upper bit") data
"A" state: "011" data
"B" state: "001" data
"C" state: "000" data
"D" state: "010" data
"E" state: "110" data
"F" state: "100" data
"G" state: "101" data The verification voltage used in each write operation is set between the adjacent threshold voltage distributions. Specifically, verification voltages AV, BV, CV, DV, EV, FV, and GV are set corresponding to the "A" state, "B" state, "C" state, "D" state, "E" state, "F" state, and "G" state, respectively.

For example, the verification voltage AV is set between the maximum threshold voltage at the "ER" state and the minimum threshold voltage at the "A" state. When the verification voltage AV in the memory cell transistor MT is applied, the memory cell transistor MT whose threshold voltage is included in the "ER" state enters an ON state, and the memory cell transistor MT whose threshold voltage is included in the threshold voltage distribution equal to or greater than the "A" state enters an OFF state.

Further, for example, other verification voltages BV, CV, DV, EV, FV, and GV are set in the same manner as the verification voltage AV. The verification voltage BV is set between the "A" state and the "B" state, the verification voltage CV is set between the "B" state and the "C" state, the verification voltage DV is set between the "C" state and the "D" state, the verification voltage EV is set between the "D" state and the "E" state, the verification voltage FV is set between the "E" state and the "F" state, and the verification voltage GV is set between the "F" state and the "G" state.

For example, the verification voltage AV may be set to 0.8 V, the verification voltage BV may be set to 1.6 V, the verification voltage CV may be set to 2.4 V, the verification voltage DV may be set to 3.1 V, the verification voltage EV may be set to 3.8 V, the verification voltage FV may be set to 4.6 V, and the verification voltage GV may be set to 5.6 V, respectively. However, the verification voltage AV, BV, CV, DV, EV, FV, and GV are not limited to the examples shown here. The verification voltage AV, BV, CV, DV, EV, FV, and GV may be appropriately and stepwise set in a range of, for example, 0 V to 7.0 V.

Further, the read voltage used in each read operation may be set between adjacent threshold voltage distributions. For example, the read voltage AR for determining whether the threshold voltage of the memory cell transistor MT is included in the "ER" state or a state, which is equal to or greater than the "A" state, is set between the maximum threshold voltage at the "ER" state and the minimum threshold voltage at the "A" state.

Other read voltages BR, CR, DR, ER, FR, and GR may be set in the same manner as the read voltage AR. For example, the read voltage BR is set between the "A" state and the "B" state, the read voltage CR is set between the "B" state and the "C" state, the read voltage DR is set between the "C" state and the "D" state, the read voltage ER is set between the "D" state and the "E" state, the read voltage FR is set between the "E" state and the "F" state, and the read voltage GR is set between the "F" state and the "G" state.

A read pass voltage VREAD is set to a voltage higher than the maximum threshold voltage of the highest threshold voltage distribution (for example, the "G" state). The memory cell transistor MT, to which the read pass voltage VREAD is applied to the gate, enters an ON state regardless of the stored data (which is represented by the threshold voltage).

It is noted that the verification voltages AV, BV, CV, DV, EV, FV, and GV are set to higher voltages than, for example, the read voltages AR, BR, CR, DR, ER, FR, and GR, respectively. That is, the verification voltages AV, BV, CV, DV, EV, FV, and GV are set in the vicinity of the lower part of the threshold voltage distributions of the "A" state, "B" state, "C" state, "D" state, "E" state, "F" state, and "G" state, respectively.

For example, when the data assignment described above is applied, the one page data of the lower bit (lower page data) in the read operation is determined by the read result by using the read voltages AR and ER. The one page data of the middle bit (middle page data) is determined by the read result by using the read voltage BR, DR, and FR. The one page data of the upper bit (upper page data) is determined by the read result by using the read voltage CR and GR. In this way, since the lower page data, the middle page data, and the upper page data are determined by the read operation two times, three times, and two times, respectively, the assignment of this data is referred to as a "2-3-2 code".

It is noted that the number of bits corresponding to the data (which is represented by the threshold voltage) stored in one memory cell transistor MT described above and the assignment of data with respect to the threshold voltage distribution of the memory cell transistor MT is an example and is not limited to the example shown here. For example, data of 2-bit or 4-bit or more may be stored in one memory cell transistor MT. Further, each read voltage and read pass voltage may be set to the same voltage value or set to the different voltage values in each method.

9. One Example of Sense Amplifier Module Operation

Figure 11:
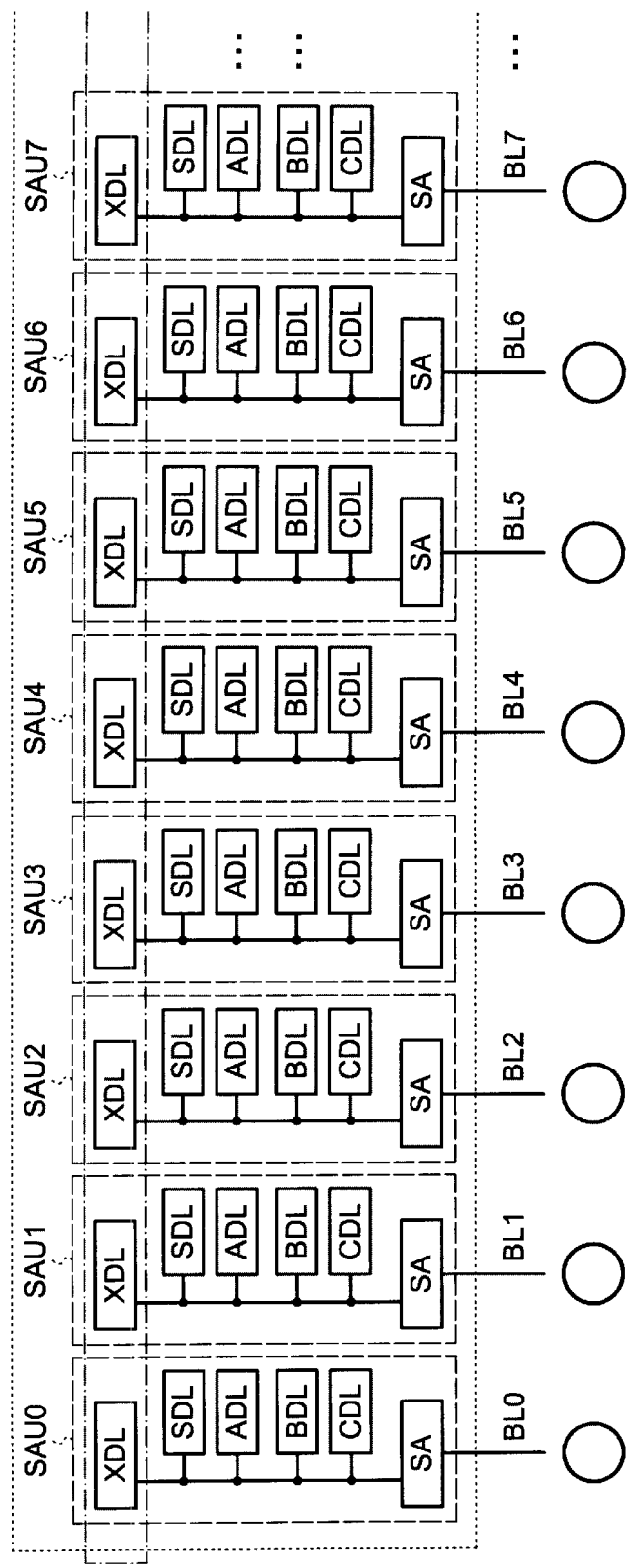
FIG. 11 is a diagram showing an operation of a sense amplifier module provided in the nonvolatile semiconductor storage device according to the embodiment.
Figure 12:
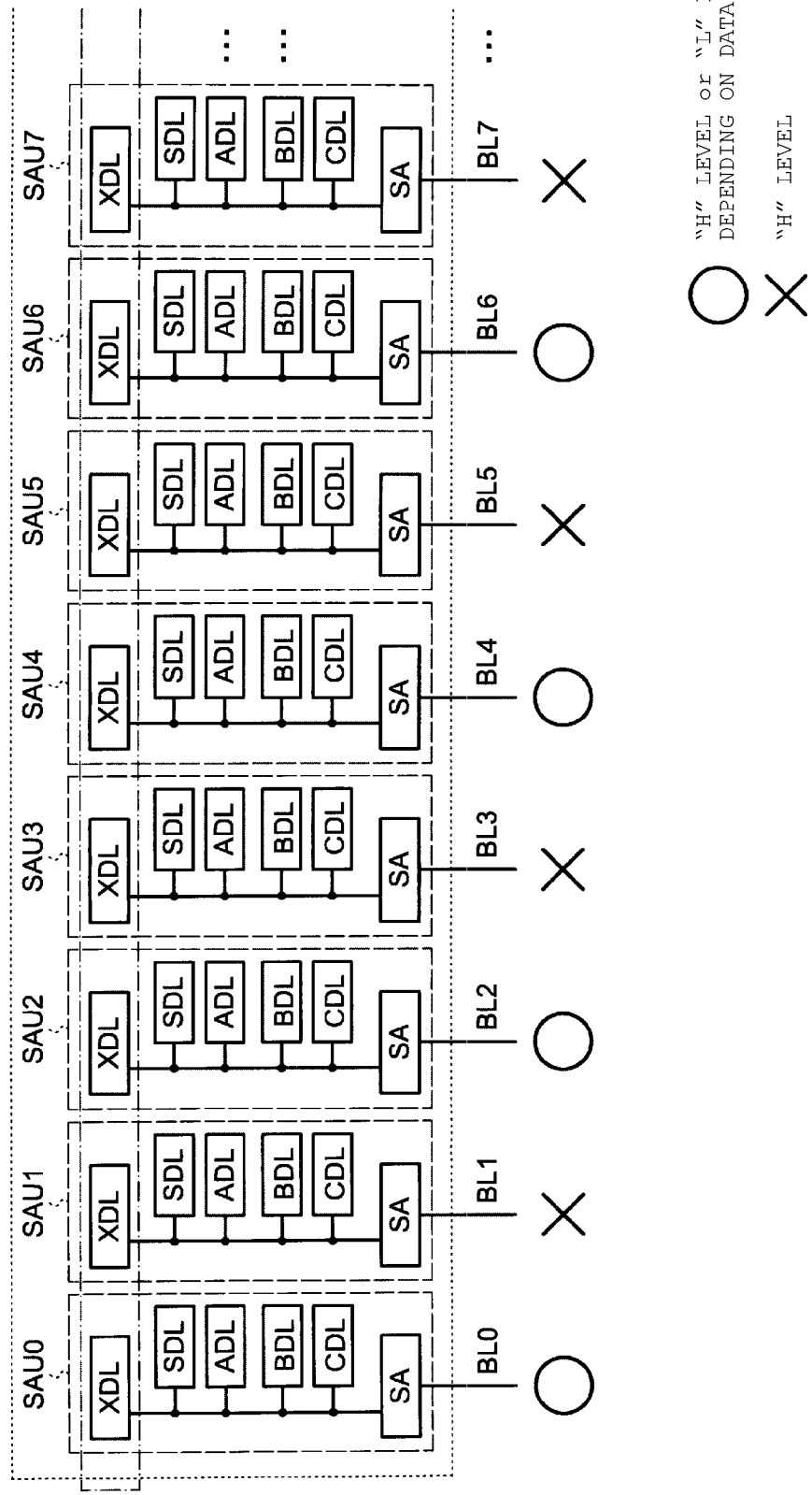
FIG. 12 is a diagram showing an operation of the sense amplifier module provided in the nonvolatile semiconductor storage device according to the embodiment.
Figure 13:
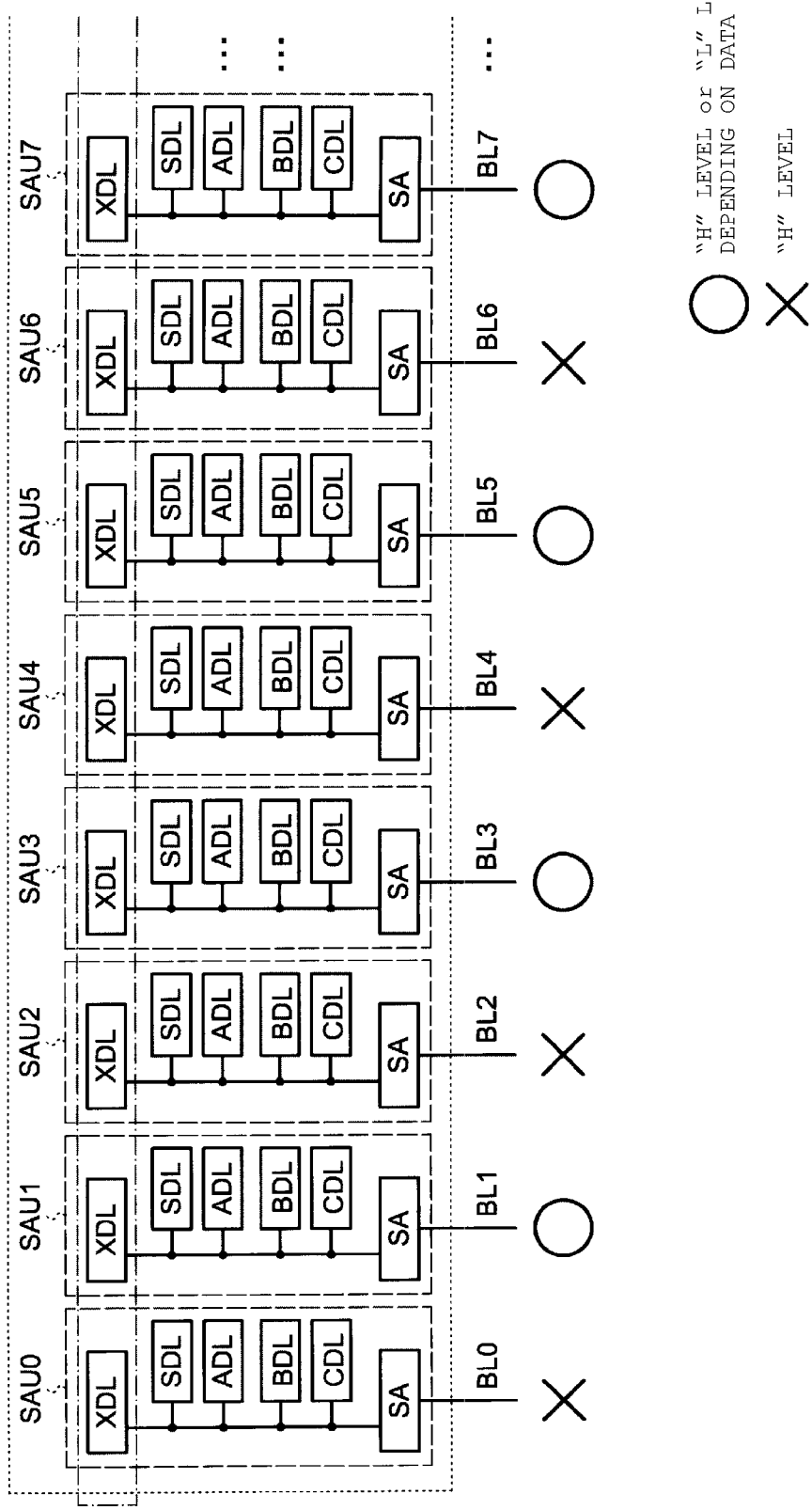
FIG. 13 is a diagram showing an operation of the sense amplifier module provided in the nonvolatile semiconductor storage device according to the embodiment.
Figure 14:
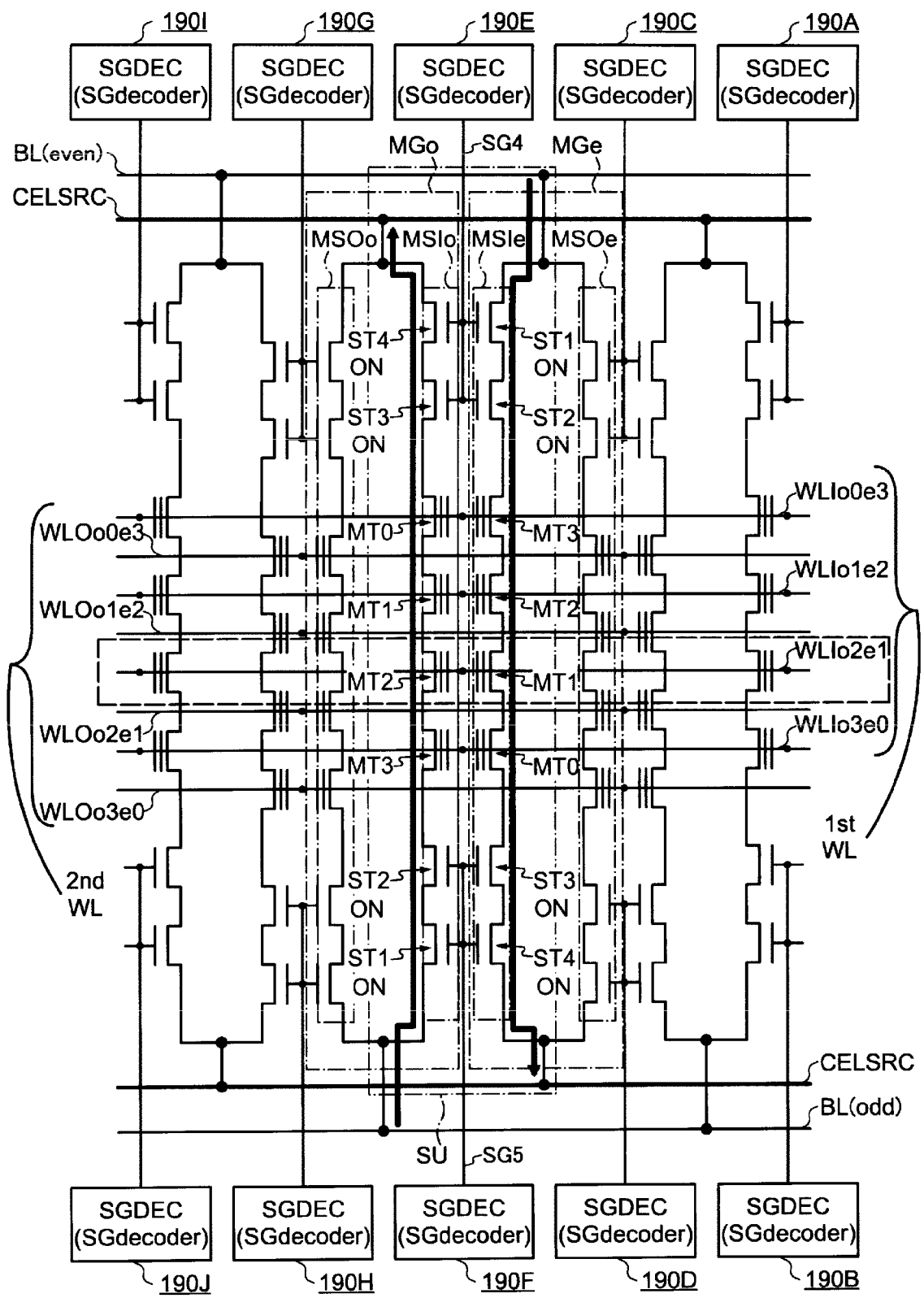
FIG. 14 is a diagram showing an example of a verification operation of the nonvolatile semiconductor storage device according to the embodiment.
Figure 15:
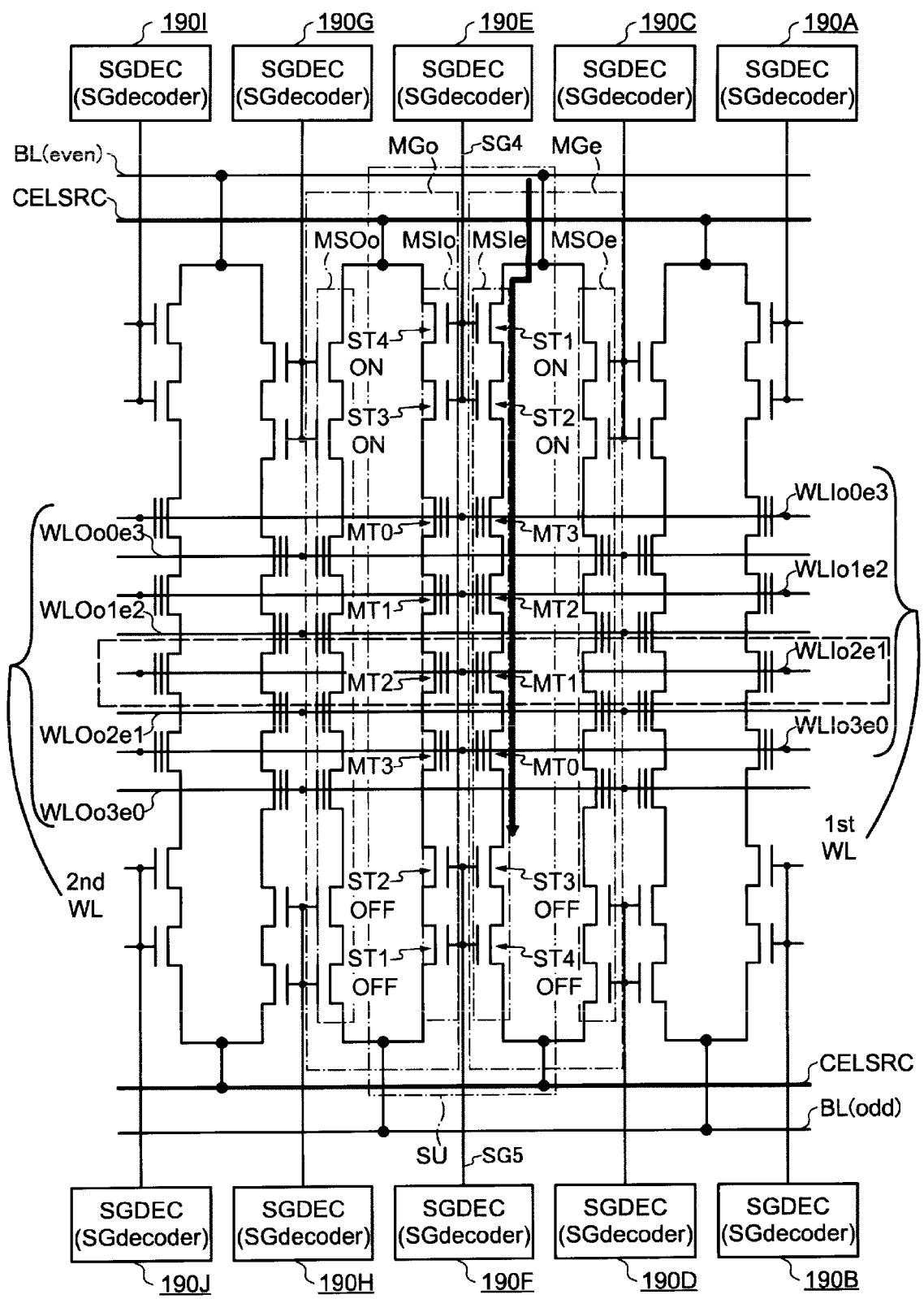
FIG. 15 is a diagram showing an example of a program operation of the nonvolatile semiconductor storage device according to the embodiment.
Figure 16:
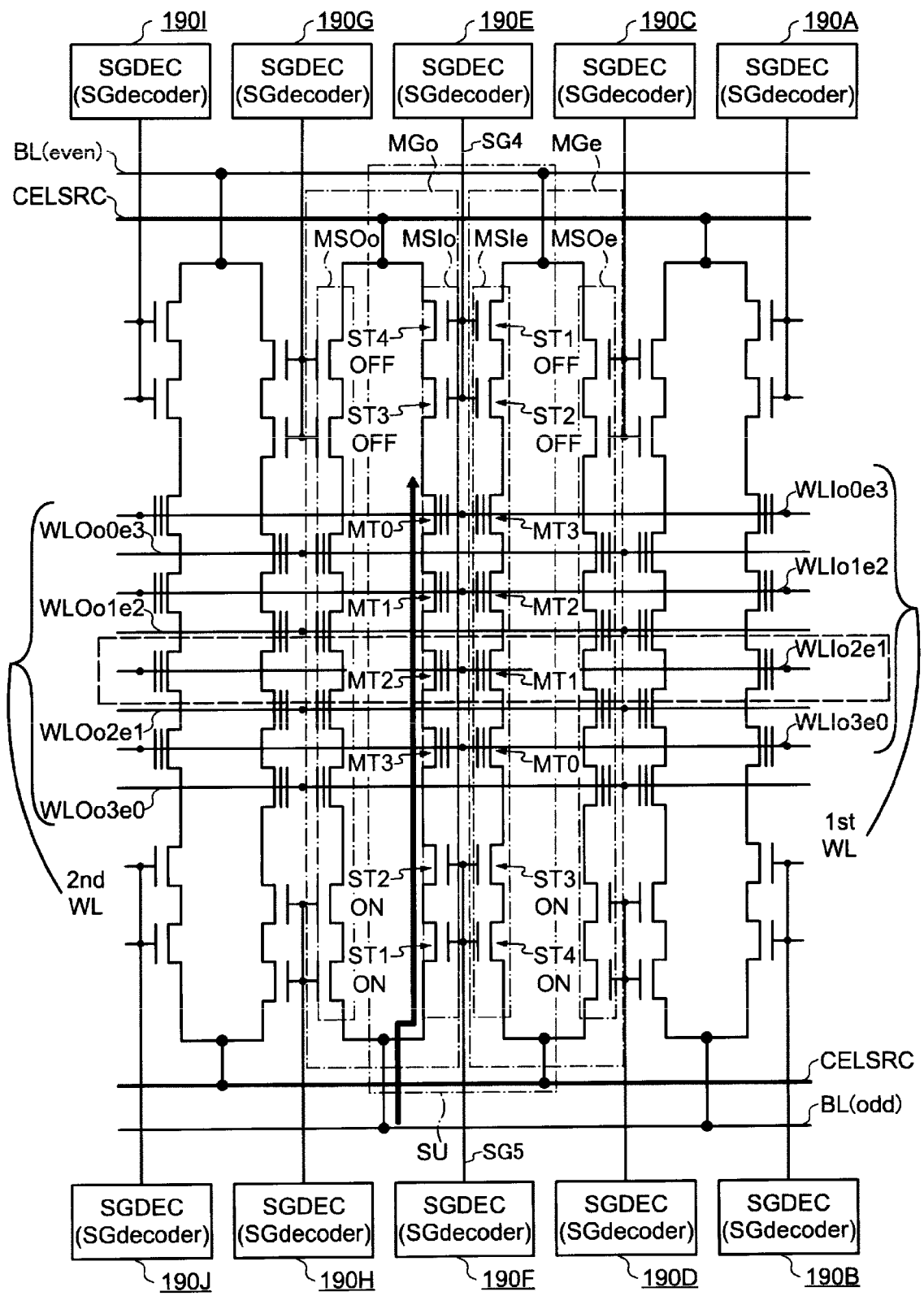
FIG. 16 is a diagram showing an example of a program operation of the nonvolatile semiconductor storage device according to the embodiment.

FIG. 11 is a diagram showing an example of a verification operation of the sense amplifier module 20 in the nonvolatile semiconductor storage device 1 according to the embodiment. FIGS. 12 and 13 are diagrams showing an example of a program operation of the sense amplifier module 20 in the nonvolatile semiconductor storage device 1 according to the embodiment. FIG. 14 is a diagram showing an example of a verification operation of the nonvolatile semiconductor storage device 1 according to the embodiment. FIGS. 15 and 16 are diagrams showing an example of a program operation of the nonvolatile semiconductor storage device 1 according to the embodiment. The operation example of the sense amplifier module 20 according to the embodiment is not limited to the configurations shown in FIGS. 11 to 16. In the description of FIGS. 11 to 16, the description of the same or similar configuration as that of FIGS. 1 to 10 may be omitted.

As shown in FIGS. 11 to 13, the sense amplifier module 20 includes, for example, sense amplifier units SAU0 to SAU7. The sense amplifier units SAU0 to SAU7 are associated with bit lines BL0 to BL7, respectively. The circuit configuration of each of the sense amplifier units SAU0 to SAU7 is the same as the circuit configuration of the sense amplifier unit SAU shown in FIG. 9.

As shown in FIG. 11, in the verification operation, each of the sense amplifier units SAU0 to SAU7 sets, for example, all of the memory cell transistors MT electrically connected to the bit lines BL0 to BL7 as a target of an operation (O in the figure). In the verification operation, each of the sense amplifier units SAU0 to SAU7 senses the data (which is represented by the threshold voltage) read from all the memory cell transistors MT electrically connected to the corresponding bit line BL and determines whether the data corresponding to the read threshold voltage is "0" or "1". The latch circuits SDL, ADL, BDL, CDL, and XDL temporarily store the data corresponding to the read threshold voltage.

For example, using FIG. 14, the current path of the memory cell transistor MT1 in the memory string MSIe electrically connected to the bit line BL (even) and the memory cell transistor MT2 in the memory string MSIo electrically connected to the bit line BL (odd), during the verification operation will be described. The timing chart shown in FIG. 8 is also referred to as appropriate.

As shown in FIG. 8, at time t20 to time t23 of the verification operation period (third operation period), the selected word line SEL-WL (word line WLIo2e1 (FIG. 14)) is supplied with a voltage VCG, and the non-selected word line USEL-WL (word line WLIo0e3, word line WLIo1e2, word line WLIo3e0, word line WLOo0e3, word line WLOo1e2, word line WLOo2e1, and word line WLOo3e0 (FIG. 14)) is supplied with a voltage VREAD. The select gate line SG4 and the select gate line SG5 are supplied with the voltage VSG_READ. The source line CELSRC, the bit line InhibitBL (even), the channel of the memory cell transistor MT of the memory string MSIe, the bit line InhibitBL (odd), and the channel of the memory cell transistor MT of the memory string MSIo are supplied with a low level voltage. The bit line ProgramBL (even) (bit line (even) (FIG. 14)) and the bit line ProgramBL (odd) (bit line (odd) (FIG. 14)) are supplied with a high level voltage.

As a result, the select transistors ST1 and ST2 in the memory string MSIe, and the select transistors ST4 and ST3 in the memory string MSIe enter an ON state, and a current (arrow in FIG. 14) flows from the bit line ProgramBL (even) (bit line BL (even) (FIG. 14)) to the source line CWLSRC. In the memory string MSIe electrically connected to the bit line BL (even), the data (which is represented by the threshold voltage) stored in the memory cell transistor MT1 to which the selected word line SEL-WL (word line WLIo2e1) is connected is read. The sense amplifier unit SAU connected to the bit line BL (even) (FIG. 14) senses the data (which is represented by the threshold voltage) read from the memory cell transistor MT2 in the memory string MSIo connected to the bit line BL (even) (FIG. 14) and determines whether the data corresponding to the read threshold voltage is "0" or "1". Further, the latch circuits SDL, ADL, BDL, CDL, and XDL temporarily store the data corresponding to the read threshold voltage.

Similarly, the select transistors ST3 and ST4 in the memory string MSIo and the select transistors ST1 and ST2 in the memory string MSIo enter an ON state, a current (arrow in FIG. 14) flows from the bit line ProgramBL (odd) (bit line BL (odd) (FIG. 14)) to the source line CWLSRC, and the data (which is represented by the threshold voltage) stored by the memory cell transistor MT2 that is provided in the memory string MSIo electrically connected to the bit line BL (odd) selected by the selected word line SEL-WL (word line WLIo2e1) is read. The sense amplifier unit SAU connected to the bit line BL (odd) (FIG. 14) senses the data (which is represented by the threshold voltage) read from the memory cell transistor MT2 in the memory string MSIo connected to the bit line BL (odd) (FIG. 14) and determines whether the data corresponding to the read threshold voltage is "0" or "1". Further, the latch circuits SDL, ADL, BDL, CDL, and XDL temporarily store the data corresponding to the read threshold voltage.

On the other hand, in the program operation, the even-numbered sense amplifier units SAU0, SAU2, SAU4, and SAU6 operate at different timings from the odd-numbered sense amplifier units SAU1, SAU3, SAU5, and SAU7.

For example, as shown in FIGS. 12 and 13, the even-numbered sense amplifier units SAU0, SAU2, SAU4, and SAU6 operate alternately with the odd-numbered sense amplifier units SAU1, SAU3, SAU5, and SAU7.

Specifically, as shown in FIG. 12, in the EVEN program operation (first operation period), the memory cell transistor MT electrically connected to the even-numbered bit lines BL0, BL2, BL4, and BL6 corresponding to the even-numbered sense amplifier units SAU0, SAU2, SAU4, and SAU6 is set as a target of an operation (O in the figure), and the memory cell transistor MT electrically connected to the odd-numbered bit lines BL1, BL3, BL5, and BL7 corresponding to the odd-numbered sense amplifier units SAU1, SAU3, SAU5, and SAU7 is not set as a target of an operation (X in the figure).

For example, using FIG. 15, the current path of the memory cell transistor MT1 in the memory string MSIe electrically connected to the bit line BL (even) and the memory cell transistor MT2 in the memory string MSIo electrically connected to the bit line BL (odd), during the EVEN program operation (first operation period) will be described. The timing chart shown in FIG. 8 is also referred to as appropriate.

As shown in FIG. 8, at time t01 to time t02 of the EVEN program operation (first operation period), the selected word line SEL-WL (word line WLIo2e1 (FIG. 15)) is supplied with a voltage VPGM, and the non-selected word line USEL-WL (word line WLIo0e3, word line WLIo1e2, word line WLIo3e0, word line WLOo0e3, word line WLOo1e2, word line WLOo2e1, and word line WLOo3e0 (FIG. 15)) is supplied with a voltage VPASS. The source line CELSRC and the bit line InhibitBL (even) are supplied with a high level voltage. The bit line ProgramBL (even) (bit line (even) (FIG. 15)), the bit line ProgramBL (odd) (bit line (odd) (FIG. 15)), the bit line InhibitBL (odd), and the select gate line SG5 are supplied with a low level voltage. The select gate line SG4 is supplied with a voltage VSG.

As a result, the select transistors ST1 and ST2 in the memory string MSIe enter an ON state, the select transistors ST4 and ST3 in the memory string MSIe enter an OFF state, and a current (arrow in FIG. 15) flows from the bit line ProgramBL (even) (bit line BL (even) (FIG. 15)) to the vicinity of the select transistor ST3 in the memory string MSIe. On the other hand, the select transistors ST3 and ST4 in the memory string MSIo enter an ON state, the select transistors ST1 and ST2 in the memory string MSIo enter an OFF state, and almost no current flows from the bit line ProgramBL (odd) (bit line BL (odd) (FIG. 15)). The channel voltages of the memory cell transistor MT3, MT2, and MT0 of the memory string MSIe connected to the bit line ProgramBL (even) (bit line BL (even) (FIG. 15)) are set to a low level. In the memory string MSIe electrically connected to the bit line ProgramBL (even) (bit line BL (even) (FIG. 15)), the gate electrode of the memory cell transistor MT1 to which the selected word line SEL-WL (word line WLIo2e1) is connected is supplied with a voltage VPGM. As a result, the voltage VPGM is applied between the memory cell transistor MT1 in the memory string MSIe connected to the bit line ProgramBL (even) (bit line BL (even) (FIG. 15)) and the low level channel, and then target data (which is represented by the threshold voltage) is programmed in the memory cell transistor MT1 of the memory string MSIe.

Following the EVEN program operation (first operation period), the verification operation period (third operation period) is executed by using the sequencer 15 (FIG. 1). At this time, the target of the verification operation is the memory cell transistor MT, which is electrically connected to the even-numbered bit lines BL0, BL2, BL4, and BL6 corresponding to the even-numbered sense amplifier units SAU0, SAU2, SAU4, and SAU6 shown in FIG. 12.

Further, as shown in FIG. 13, in the ODD program operation (second operation period) following the EVEN program operation (first operation period), the memory cell transistor MT electrically connected to the odd-numbered bit lines BL1, BL3, BL5, and BL7 corresponding to the odd-numbered sense amplifier units SAU1, SAU3, SAU5, and SAU7 is set as a target of an operation (O in the figure), and the memory cell transistor MT electrically connected to the even-numbered bit lines BL0, BL2, BL4, and BL6 corresponding to the even-numbered sense amplifier units SAU0, SAU2, SAU4, and SAU6 is not set as a target of an operation (X in the figure).

For example, using FIG. 16, the current path of the memory cell transistor MT2 in the memory string MSIo electrically connected to the bit line BL (odd) and the memory cell transistor MT1 in the memory string MSIe electrically connected to the bit line BL (even), during the ODD program operation (second operation period) will be described. The timing chart shown in FIG. 8 is also referred to as appropriate.

As shown in FIG. 8, at time t21 to time t22 of the ODD program operation (second operation period), the selected word line SEL-WL (word line WLIo2e1 (FIG. 16)) is supplied with a voltage VPGM, and the non-selected word line USEL-WL (word line WLIo0e3, word line WLIo1e2, word line WLIo3e0, word line WLOo0e3, word line WLOo1e2, word line WLOo2e1, and word line WLOo3e0 (FIG. 16)) is supplied with a voltage VPASS. The source line CELSRC and the bit line InhibitBL (odd) are supplied with a high level voltage. The bit line ProgramBL (odd) (bit line (odd) (FIG. 16)), the bit line ProgramBL (even) (bit line (even) (FIG. 16)), the bit line InhibitBL (even), and the select gate line SG4 are supplied with a low level voltage. The select gate line SG5 is supplied with a voltage VSG.

As a result, the select transistors ST1 and ST2 in the memory string MSIo enter an ON state, the select transistors ST4 and ST3 in the memory string MSIo enter an OFF state, and a current (arrow in FIG. 16) flows from the bit line ProgramBL (odd) (bit line BL (odd) (FIG. 16)) to the vicinity of the select transistor ST0 in the memory string MSIo. On the other hand, the select transistors ST3 and ST4 in the memory string MSIe enter an ON state, the select transistors ST1 and ST2 in the memory string MSIe enter an OFF state, and almost no current flows from the bit line ProgramBL (even) (bit line BL (even) (FIG. 16)). The channel voltages of the memory cell transistor MT3, MT1, and MT0 of the memory string MSIo connected to the bit line ProgramBL (odd) (bit line BL (odd) (FIG. 16)) are set to a low level. In the memory string MSIo electrically connected to the bit line ProgramBL (odd) (bit line BL (odd) (FIG. 16)), the gate electrode of the memory cell transistor MT2 to which the selected word line SEL-WL (word line WLIo2e1) is connected is supplied with a voltage VPGM. As a result, the voltage VPGM is applied between the memory cell transistor MT2 in the memory string MSIo electrically connected to the bit line ProgramBL (odd) (bit line BL (odd) (FIG. 16)) and the low level channel, and then desirable data (which is represented by the threshold voltage) is programmed in the memory cell transistor MT2 of the memory string MSIo.

Following the ODD program operation (second operation period), the verification operation period (third operation period) is executed by using the sequencer 15 (FIG. 1). At this time, the target of the verification operation is the memory cell transistor MT, which is electrically connected to the odd-numbered bit lines BL1, BL3, BL5, and BL7 corresponding to the odd-numbered sense amplifier units SAU1, SAU3, SAU5, and SAU7 shown in FIG. 13.

It is noted that in the first operation period, the odd-numbered sense amplifier unit may be set as a target of an operation, instead of the even-numbered sense amplifier unit, and in the second operation period, the even-numbered sense amplifier unit may be set as a target of an operation (O in the figure), instead of the odd-numbered sense amplifier unit.

Other Embodiments

In the above embodiment, the phrase "a certain voltage is applied" and the phrase "a certain voltage is supplied" cover both the control of applying or supplying the voltage and the actual application or supply of the voltage. Further, applying or supplying a certain voltage may include applying or supplying a voltage of, for example, 0 V.

As used herein, the term "connection" refers to an electrical connection and does not exclude, for example, the use of another element in between.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A nonvolatile semiconductor storage device comprising:
   first and second semiconductor layers that extend in a first direction and are spaced apart from each other in a second direction that intersects the first direction, the first semiconductor layer having a first side that is on a side of the second semiconductor layer in the second direction and a second side that is on an opposite side of the first side of the first semiconductor layer, and the second semiconductor layer having a first side that is on a side of the first semiconductor layer in the second direction and a second side that is on an opposite side of the first side of the second semiconductor layer;
   first and second bit lines extending in the second direction;
   first and second source lines extending in a third direction that intersects the first and second directions and on opposite sides of the first and second semiconductor layers in the first direction;
   a first memory string on the first side of the first semiconductor layer and including a first select transistor connected to the first bit line, a second select transistor connected to the first source line, a plurality of first memory cell transistors connected between the first select transistor and the second select transistor;
   a second memory string on the second side of the first semiconductor layer and including a third select transistor connected to the first bit line, a fourth select transistor connected to the first source line, and a plurality of second memory cell transistors connected between the third select transistor and the fourth select transistor;
   a third memory string on the first side of the second semiconductor layer and including a fifth select transistor connected to the second bit line, a sixth select transistor connected to the second source line, and a plurality of third memory cell transistors connected between the fifth select transistor and the sixth select transistor;
   a fourth memory string on the second side of the second semiconductor layer and including a seventh select transistor connected to the second bit line, an eighth select transistor connected to the second source line, and a plurality of fourth memory cell transistors connected between the seventh select transistor and the eighth select transistor;
   a first select gate line that is electrically connected to a gate electrode of the first select transistor and a gate electrode of the sixth select transistor; and
   a second select gate line that is electrically connected to a gate electrode of the second select transistor and a gate electrode of the fifth select transistor,
   wherein the first and second bit lines are respectively located on opposite sides of the first and second semiconductor layers and on opposite sides of the first, second, third, and fourth memory strings, in the first direction.

2. The nonvolatile semiconductor storage device according to claim 1, wherein
   the first and second semiconductor layers are between the first bit line and the first source line in the first direction, and between the second bit line and the second source line in the first direction.

3. The nonvolatile semiconductor storage device according to claim 1, further comprising:
   a plurality of even bit lines stacked in the third direction, wherein the first bit line is one of the even bit lines; and
   a plurality of odd bit lines stacked in the third direction, wherein the second bit line is one of the odd bit lines.

4. The nonvolatile semiconductor storage device according to claim 1, further comprising:

a first word line extending in the third direction between and connected to gate electrodes of one of the plurality of first memory cell transistors and one of the plurality of third memory cell transistors, and a second word line extending in the third direction connected to gate electrodes of one of the plurality of second memory cell transistors and one of the plurality of fourth memory cell transistors.

5. The nonvolatile semiconductor storage device according to claim 4, further comprising:

a controller capable of controlling voltages applied to the first select gate line and the second select gate line at different timings.

6. The nonvolatile semiconductor storage device according to claim 5, wherein in a first operation period, the first bit line and the second bit line are supplied with a second voltage that is lower than a first voltage, and then the first and second select gate lines are respectively supplied with a third voltage that is higher than the first voltage, and the second voltage, and the first and second word lines are respectively supplied with a fourth voltage that is higher than the third voltage, and a fifth voltage that is higher than the third voltage and lower than the fourth voltage, in a second operation period following the first operation period, the second bit line is supplied with the first voltage and the first bit line is supplied with the second voltage, and then the first and second select gate lines are respectively supplied with the second voltage and the third voltage, and the first and second word lines are supplied with the fifth voltage, and in both the first operation period and the second operation period, the first source line and the second source line are supplied with a sixth voltage that is higher than the second voltage.

7. The nonvolatile semiconductor storage device according to claim 6, wherein in a third operation period following the second operation period:

the first source line, the second source line, and the second bit line are supplied with the second voltage;

the first select gate line and the second select gate line are supplied with a seventh voltage that is different from the third voltage;

the first bit line is supplied with an eighth voltage that is higher than the second voltage and different from the first voltage;

the first word line is supplied with a ninth voltage that is different from the fourth voltage and the fifth voltage; and the second word line is supplied with a tenth voltage that is different from the fourth voltage and the fifth voltage, and higher than the ninth voltage.

8. The nonvolatile semiconductor storage device according to claim 5, wherein in a first operation period, the first bit line is supplied with a first voltage and the second bit line is supplied with a second voltage that is lower than the first voltage, and then the first and second select gate lines are respectively supplied with a third voltage that is higher than the first voltage, and the second voltage, and the first word line and the second word lines are supplied with a fourth voltage that is higher than the third voltage, in a second operation period following the first operation period, the second bit line and the first bit line are supplied with the second voltage, and then the first and second select gate lines are respectively supplied with the second voltage and the third voltage, and the first and second word lines are respectively supplied with the fourth voltage, and a fifth voltage that is higher than the fourth voltage, and in both the first operation period and the second operation period, the first source line and the second source line are supplied with a sixth voltage that is higher than the second voltage.

9. The nonvolatile semiconductor storage device according to claim 8, wherein in a third operation period following the second operation period, the first source line, the second source line, and the first bit line are supplied with the second voltage, the first select gate line and the second select gate line are supplied with a seventh voltage that is different from the third voltage, the second bit line is supplied with an eighth voltage that is higher than the second voltage and different from the first voltage, the second word line is supplied with a ninth voltage that is different from the fourth voltage and the fifth voltage, and the first word line is supplied with a tenth voltage that is different from the fourth voltage and the fifth voltage, and higher than the ninth voltage.

10. The nonvolatile semiconductor storage device according to claim 1, wherein each of the first memory cell transistors is aligned with one of the third memory cell transistors along the second direction, and each of the second memory cell transistors is aligned with one of the fourth memory cell transistors along the second direction.

11. The nonvolatile semiconductor storage device according to claim 1, wherein first locations of the first memory cell transistors along the first direction are offset in the second direction with respect to second locations of the second memory cell transistors, and third locations of the third memory cell transistors along the first direction are offset in the second direction with respect to fourth locations of the fourth memory cell transistors.

12. A method of performing a write operation in a nonvolatile semiconductor storage device comprising:

first and second semiconductor layers that extend in a first direction and are spaced apart from each other in a second direction that intersects the first direction, the first semiconductor layer having a first side that is on a side of the second semiconductor layer in the second direction and a second side that is on an opposite side of the first side of the first semiconductor layer, and the second semiconductor layer having a first side that is on a side of the first semiconductor layer in the second direction and a second side that is on an opposite side of the first side of the second semiconductor layer;

first and second bit lines extending in the second direction;

first and second source lines extending in a third direction that intersects the first and second directions and on opposite sides of the first and second semiconductor layers in the first direction;

a first memory string on the first side of the first semiconductor layer and including a first select transistor connected to the first bit line, a second select transistor connected to the first source line, a plurality of first memory cell transistors connected between the first select transistor and the second select transistor;

a second memory string on the second side of the first semiconductor layer and including a third select transistor connected to the first bit line, a fourth select transistor connected to the first source line, and a plurality of second memory cell transistors connected between the third select transistor and the fourth select transistor;

a third memory string on the first side of the second semiconductor layer and including a fifth select transistor connected to the second bit line, a sixth select transistor connected to the second source line, and a plurality of third memory cell transistors connected between the fifth select transistor and the sixth select transistor;

a fourth memory string on the second side of the second semiconductor layer and including a seventh select transistor connected to the second bit line, an eighth select transistor connected to the second source line, and a plurality of fourth memory cell transistors connected between the seventh select transistor and the eighth select transistor;

a first select gate line that is electrically connected to a gate electrode of the first select transistor and a gate electrode of the sixth select transistor; and a second select gate line that is electrically connected to a gate electrode of the second select transistor and a gate electrode of the fifth select transistor, wherein the first and second bit lines are respectively located on opposite sides of the first and second semiconductor layers and on opposite sides of the first, second, third, and fourth memory strings, in the first direction, said method comprising:
performing a first program operation on a selected one of the first memory cell transistors using the first bit line;
performing a second program operation on a selected one of the second memory cell transistors using the second bit line; and
concurrently performing a verification operation on the selected first memory cell transistor and the selected second memory cell transistor.

13. The method according to claim 12, wherein the first and second semiconductor layers are between the first bit line and the first source line in the first direction, and between the second bit line and the second source line in the first direction.

14. The method according to claim 12, wherein the nonvolatile semiconductor storage device further comprises:
a plurality of even bit lines stacked in the third direction, wherein the first bit line is one of the even bit lines; and
a plurality of odd bit lines stacked in the third direction, wherein the second bit line is one of the odd bit lines.

15. The method according to claim 12, wherein the nonvolatile semiconductor storage device further comprises:
a first word line extending in the third direction between and connected to gate electrodes of one of the plurality of first memory cell transistors and one of the plurality of third memory cell transistors, and
a second word line extending in the third direction connected to gate electrodes of one of the plurality of second memory cell transistors and one of the plurality of fourth memory cell transistors.

16. The method according to claim 15, wherein the nonvolatile semiconductor storage device further comprises:
a controller capable of controlling voltages applied to the first select gate line and the second select gate line at different timings.

17. The method according to claim 16, wherein
during the first program operation,
the first bit line and the second bit line are supplied with a second voltage that is lower than a first voltage, and then
the first and second select gate lines are respectively supplied with a third voltage that is higher than the first voltage, and the second voltage, and the first and second word lines are respectively supplied with a fourth voltage that is higher than the third voltage, and a fifth voltage that is higher than the third voltage and lower than the fourth voltage,
during the second program operation,
the second bit line is supplied with the first voltage and the first bit line is supplied with the second voltage, and then
the first and second select gate lines are respectively supplied with the second voltage and the third voltage, and the first and second word lines are supplied with the fifth voltage, and
during both the first and second program operations,
the first source line and the second source line are supplied with a sixth voltage that is higher than the second voltage.

18. The method according to claim 17, wherein
during the verification operation:
the first source line, the second source line, and the second bit line are supplied with the second voltage;
the first select gate line and the second select gate line are supplied with a seventh voltage that is different from the third voltage;
the first bit line is supplied with an eighth voltage that is higher than the second voltage and different from the first voltage;
the first word line is supplied with a ninth voltage that is different from the fourth voltage and the fifth voltage; and
the second word line is supplied with a tenth voltage that is different from the fourth voltage and the fifth voltage, and higher than the ninth voltage.

19. The method according to claim 16, wherein
during the first program operation,
the first bit line is supplied with a first voltage and the second bit line is supplied with a second voltage that is lower than the first voltage, and then
the first and second select gate lines are respectively supplied with a third voltage that is higher than the first voltage, and the second voltage, and the first word line and the second word lines are supplied with a fourth voltage that is higher than the third voltage,
during the second program operation,
the second bit line and the first bit line are supplied with the second voltage, and then
the first and second select gate lines are respectively supplied with the second voltage and the third voltage, and the first and second word lines are respectively supplied with the fourth voltage, and a fifth voltage that is higher than the fourth voltage, and during both the first and second program operations,
the first source line and the second source line are supplied with a sixth voltage that is higher than the second voltage.

20. The method according to claim 19, wherein
during the verification operation:
the first source line, the second source line, and the first bit line are supplied with the second voltage,
the first select gate line and the second select gate line are supplied with a seventh voltage that is different from the third voltage,
the second bit line is supplied with an eighth voltage that is higher than the second voltage and different from the first voltage,
the second word line is supplied with a ninth voltage that is different from the fourth voltage and the fifth voltage, and
the first word line is supplied with a tenth voltage that is different from the fourth voltage and the fifth voltage, and higher than the ninth voltage.

\* \* \* \* \*